(12) United States Patent
Nakamura et al.

(10) Patent No.: US 8,134,082 B2
(45) Date of Patent: Mar. 13, 2012

(54) SOLID PRINTED CIRCUIT BOARD AND METHOD OF MANUFACTURING THE SAME

(75) Inventors: Tadashi Nakamura, Osaka (JP); Fumio Echigo, Osaka (JP); Takayuki Kita, Osaka (JP); Kota Fukasawa, Yamanashi (JP); Shogo Hirai, Osaka (JP)

(73) Assignee: Panasonic Corporation, Osaka (JP)

( * ) Notice: Subject to any disclaimer, the term of this patent is extended or adjusted under 35 U.S.C. 154(b) by 172 days.

(21) Appl. No.: 12/377,134

(22) PCT Filed: May 28, 2008

(86) PCT No.: PCT/JP2008/001323
§ 371 (c)(1),
(2), (4) Date: Feb. 11, 2009

(87) PCT Pub. No.: WO2008/149511
PCT Pub. Date: Dec. 11, 2008

(65) Prior Publication Data
US 2010/0170700 A1 Jul. 8, 2010

(30) Foreign Application Priority Data

| | | |
|---|---|---|
| May 29, 2007 | (JP) | 2007-141522 |
| Jul. 9, 2007 | (JP) | 2007-179535 |
| Jul. 9, 2007 | (JP) | 2007-179536 |
| Jul. 9, 2007 | (JP) | 2007-179537 |
| Jul. 9, 2007 | (JP) | 2007-179538 |
| Nov. 14, 2007 | (JP) | 2007-295426 |

(51) Int. Cl.
*H05K 3/02* (2006.01)
*H05K 3/10* (2006.01)
*H05K 1/03* (2006.01)
*H05K 1/09* (2006.01)

(52) U.S. Cl. ............... 174/256; 174/260; 29/846

(58) Field of Classification Search .......... 174/256–260; 361/792–795; 29/846–854
See application file for complete search history.

(56) References Cited

U.S. PATENT DOCUMENTS 7,420,127 B2 * 9/2008 Asami et al. ............... 174/259
7,442,879 B2 * 10/2008 Das et al. .................. 174/262

FOREIGN PATENT DOCUMENTS

| JP | 2002-64271 A | 2/2002 |
|---|---|---|
| JP | 2004-72124 A | 3/2004 |
| JP | 2004-253774 A | 9/2004 |
| JP | 2005-158923 A | 6/2005 |
| JP | 2005-175115 A | 6/2005 |
| JP | 2006-156432 A | 6/2006 |

OTHER PUBLICATIONS

International Search Report for PCT/JP2008/001323, Sep. 9, 2008.

* cited by examiner

*Primary Examiner* — Jeremy Norris
(74) *Attorney, Agent, or Firm* — RatnerPrestia

(57) ABSTRACT

A solid printed circuit board is manufactured by bonding upper and lower printed circuit boards having different shapes and provided with wirings formed on surfaces thereof. A bonding layer is made of insulating material containing thermosetting resin and inorganic filler dispersed therein, and has a via-conductor made of conductive paste filling a through-hole perforated in a predetermined position of the bonding layer. This circuit board provides a packaging configuration achieving small size and thickness and three-dimensional mounting suitable for semiconductors of high performance and multiple-pin structure.

16 Claims, 24 Drawing Sheets

SOLID PRINTED CIRCUIT BOARD AND METHOD OF MANUFACTURING THE SAME

This application is a U.S. National Phase Application of PCT International Application PCT/JP2008/001323.

TECHNICAL FIELD

The present invention relates to a solid printed circuit board used for various electronic apparatuses, such as personal computers, portable telephones, and video cameras, and to a method of manufacturing the circuit board.

BACKGROUND ART

Portable products, such as personal computers, digital cameras, and portable phones, have recently prevailed and have been demanded to have small sizes, low profiles, small weights, high densities, and multifunction. According to this demand, semiconductors have their packages having small sizes, low profiles, and three-dimensional mounting. A cavity board is known as a method of easily providing a semiconductor package having a low profile and three-dimensional mounting.

A conventional cavity board will be described below with reference to FIG. 24. FIG. 24 is a sectional view of a conventional solid printed circuit board having a cavity. In FIG. 24, lower printed circuit board 22 and upper printed circuit board 23 are stacked across bonding layer 21 between the boards while electrodes and windows are positioned. Then, circuit boards 22 and 23 and bonding layer 21 are heated and pressed to provide multilayer printed circuit board 27 having a cavity for inserting an electronic component. Patent document 1 is known as a prior art document related to the present invention.

The conventional multilayer printed circuit board shown in FIG. 24 generally uses a prepreg as the bonding layer. Prepregs contain core materials, such as woven fabrics, unwoven fabrics, or films, hence effectively holding shapes of via-conductors made of conductive paste. The prepregs prevent wirings thereon from being embedded in the upper and lower printed circuit boards. Bonding sheets, instead of the prepregs as the bonding layer, allows the wirings to be embedded therein, but cause the conductive paste filled in the bonding layer to flow. This problem prevents complete interconnections between circuit boards having a lot of pins, and reduces a wiring density within the circuit boards.

Patent Document 1: JP 2004-253774A

SUMMARY OF THE INVENTION

The present invention relates to a solid printed circuit board including plural printed circuit boards having different shapes and having wirings thereon, and a bonding layer bonding these printed circuit boards. The bonding layer is made of insulating material containing resin. A through-hole is provided in the bonding layer. The bonding layer includes a via-conductor made of conductive paste filling the through-hole. This structure connects between the circuit boards having pins while increasing the wiring density within the circuit boards. The circuit board has a recess to have an electronic component mounted therein, thus providing the printed circuit board with a low profile.

REFERENCE NUMERALS

1 Upper Printed Circuit Board
2 Lower Printed Circuit Board
3 Bonding Layer
4 Recess
5 Component
6 Conductive Paste
7 Via-conductor
8 PET Film
9 Through-Hole
10 Wiring
11 Permanent Resist
12 Adhesive Layer
13 Cover Film
15 Flow-Out Resin
16 Solid Printed Circuit Board
17 Metal Film
18 Frame
19 Potting Resin

DETAILED DESCRIPTION OF PREFERRED EMBODIMENTS

Exemplary Embodiment 1

Figure 1A:
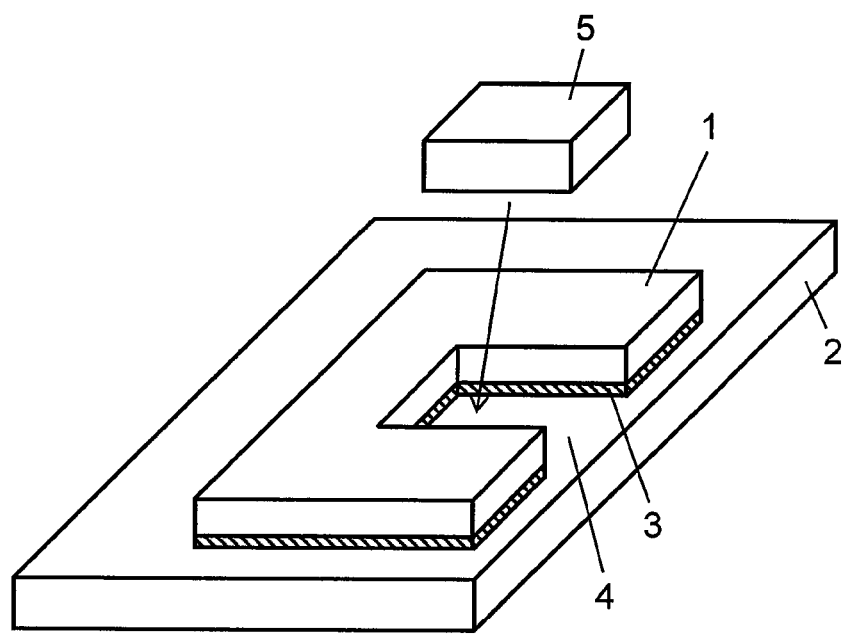
FIG. 1A is a perspective view of a solid printed circuit board according to Exemplary Embodiment 1 of the present invention.
Figure 1B:
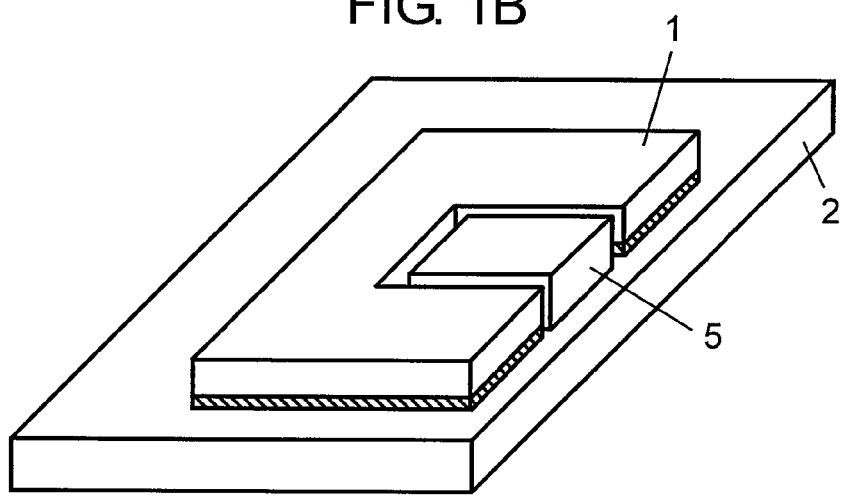
FIG. 1B is a perspective view of the solid printed circuit board according to Embodiment 1 of the invention.

Exemplary Embodiment 1 of the present invention will be described below with reference to accompanying drawings. FIGS. 1A and 1B are perspective views of a solid printed circuit board according to this embodiment. The solid printed circuit board according to this embodiment includes upper printed circuit board 1 and lower printed circuit board 2 having different shapes from each other and having wirings formed thereon, and bonding layer 3. Since upper printed circuit board 1 and lower printed circuit board 2 having different shapes, the circuit boards form recess 4, a cavity, as shown in FIG. 1A. Bonding layer 3 has a thickness ranging preferably from 30 to 300 μm. Bonding layer 3 having a thickness less than 30 μm may prevent a wiring from being embedded preferably. Bonding layer 3 having a thickness exceeding 300 μm prevents a via-conductor from having a small diameter in order to maintain an aspect ratio of the via-conductor, and may reduce reliability of connection.

Figure 1C:
FIG. 1C is a sectional view of a bonding layer of the solid printed circuit board according to Embodiment 1 of the invention.

FIG. 1C is an enlarged sectional view of bonding layer 3 according to this embodiment. Bonding layer 3 is made of insulating material containing thermosetting resin and inorganic filler dispersed in the thermosetting resin. Bonding layer has via-conductors 7 filled with conductive paste 6.

The inorganic filler in the insulating material is at least one selected from a group consisting of silica, alumina, and barium titanate. The inorganic filler has a particle diameter ranging from 1 to 15 μm, and is contained in the insulating material by 70 to 90% by weight. The inorganic filler contained by less than 70% is regarded as less dense with respect to an amount of the thermosetting resin composing bonding layer 3 so as to cause the inorganic filler to flow out when the thermosetting resin flows in pressing process. The inorganic filler exceeding 90% reducing the amount of the resin in bonding layer 3, hence preventing the wiring from being embedded and preventing the bonding layer from adhering.

Conductive paste 6 used for the printed circuit board is made any of copper, silver, gold, palladium, bismuth and tin, or alloy thereof, and has a particle diameter ranging preferably from 1 to 20 μm.

A method of manufacturing the solid printed circuit board according to this embodiment will be described in detail below.

Figure 2A:
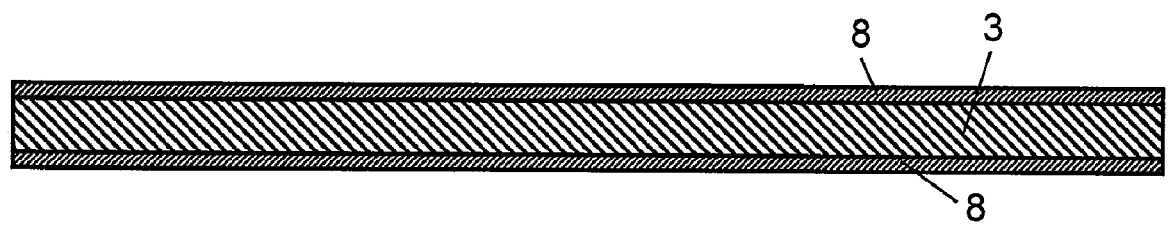
FIG. 2A is a sectional view of the bonding layer of the solid printed circuit board according to Embodiment 1 of the invention.
Figure 2B:
FIG. 2B is a sectional view of the bonding layer of the solid printed circuit board according to Embodiment 1 of the invention.
Figure 2C:
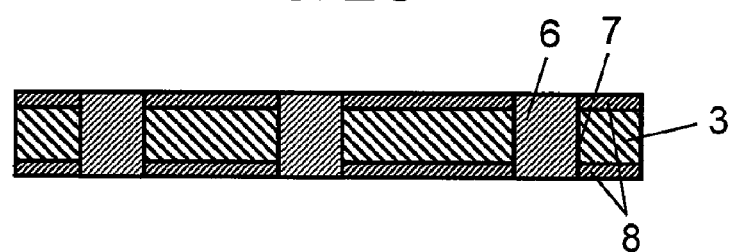
FIG. 2C is a sectional view of the bonding layer of the solid printed circuit board according to Embodiment 1 of the invention.
Figure 2D:
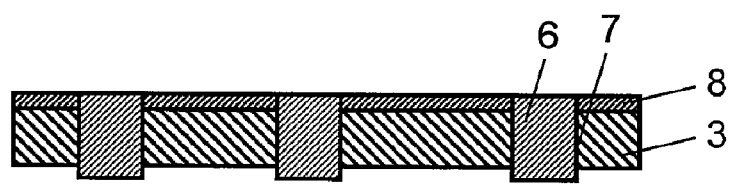
FIG. 2D is a sectional view of the bonding layer of the solid printed circuit board according to Embodiment 1 of the invention.

FIGS. 2A, 2B, 2C and 2D are sectional views of the bonding layer in the order of manufacturing processes. First, PET films 8 are attached onto both surfaces of bonding layer 3, as shown in FIG. 2A. Then, bonding layer 3 is cut into the shape of upper printed circuit board 1, and through-holes 9 are perforated at positions for connecting wirings on upper printed circuit board 1 and lower printed circuit board 2, as shown in FIG. 2B. Through-holes 9 are then filled with conductive paste 6 made of copper or copper alloy to form via-conductors 7, as shown in FIG. 2C. Then, one of PET films 8 is peeled off from one surface of bonding layer 3 on which either upper printed circuit board 1 or lower printed circuit board 2 is to be bonded, as shown in FIG. 2D. According to this embodiment, the PET film on the lower surface is peeled off to bond lower printed circuit board 2 first. However, the other PET film on the upper surface may be peeled off first.

Figure 3A:
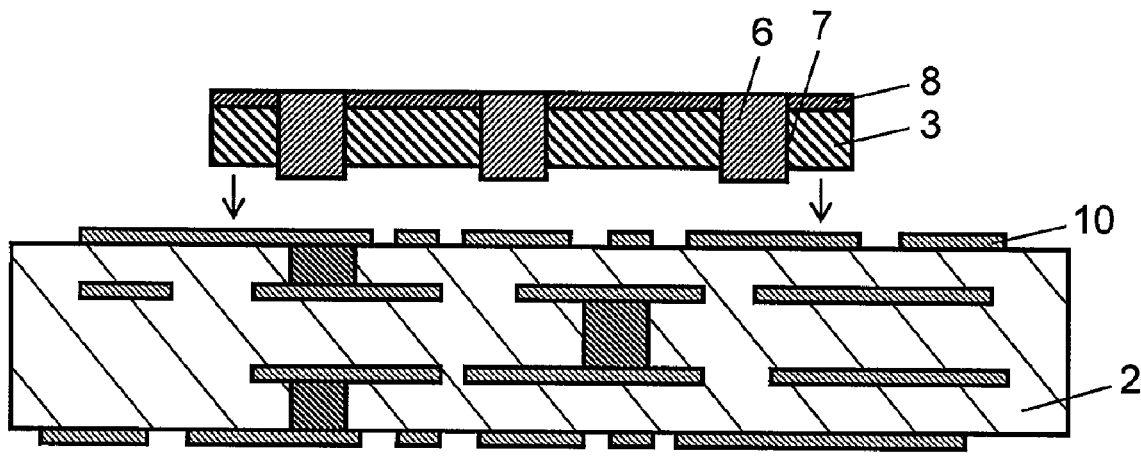
FIG. 3A is a sectional view of the bonding layer and a lower printed circuit board of the solid printed circuit board according to Embodiment 1 of the invention.
Figure 3B:
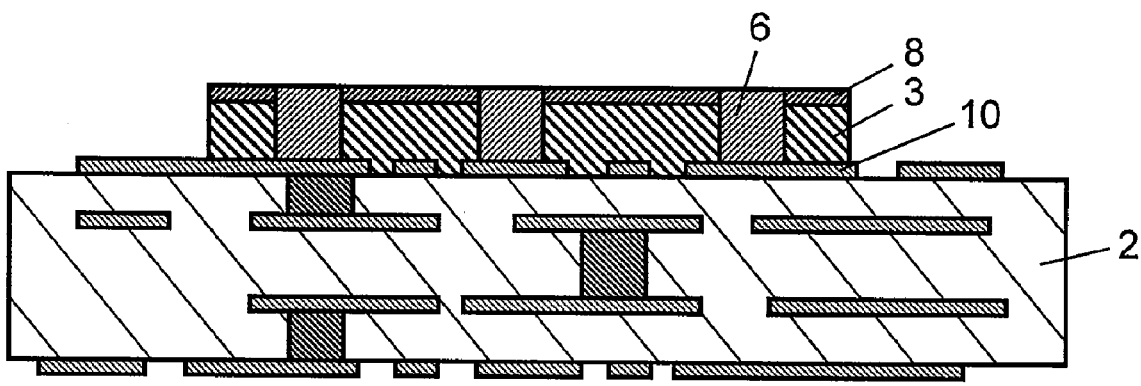
FIG. 3B is a sectional view of the bonding layer and the lower printed circuit board of the solid printed circuit board according to Embodiment 1 of the invention.
Figure 3C:
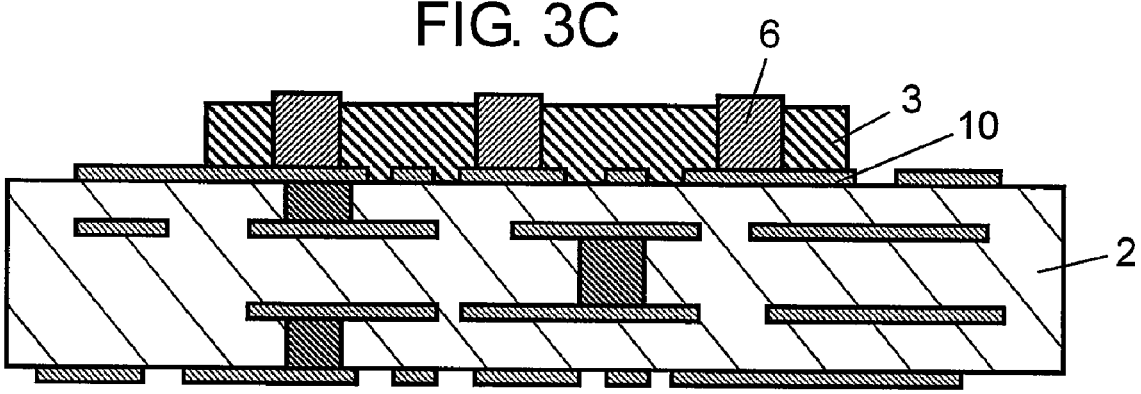
FIG. 3C is a sectional view of the bonding layer and the lower printed circuit board of the solid printed circuit board according to Embodiment 1 of the invention.

FIGS. 3A, 3B and 3C are sectional views of bonding layer 3 and lower printed circuit board 2 in the order of manufacturing processes. In a processes subsequent to the process shown in FIG. 2D, bonding layer 3 is placed at a proper position on lower printed circuit board 2, as indicated by an arrow in FIG. 3A. Conductive paste 6 is temporarily fixed onto wirings 10 formed on lower printed circuit board 2, as shown in FIG. 3B. Wirings 10 are embedded in bonding layer 3 in this temporary fixing. Conductive paste 6 is compresses, and accordingly, is connected securely with wirings 10. Then, PET film 8 left intact on the other surface is peeled off, as shown in FIG. 3C.

Figure 4A:
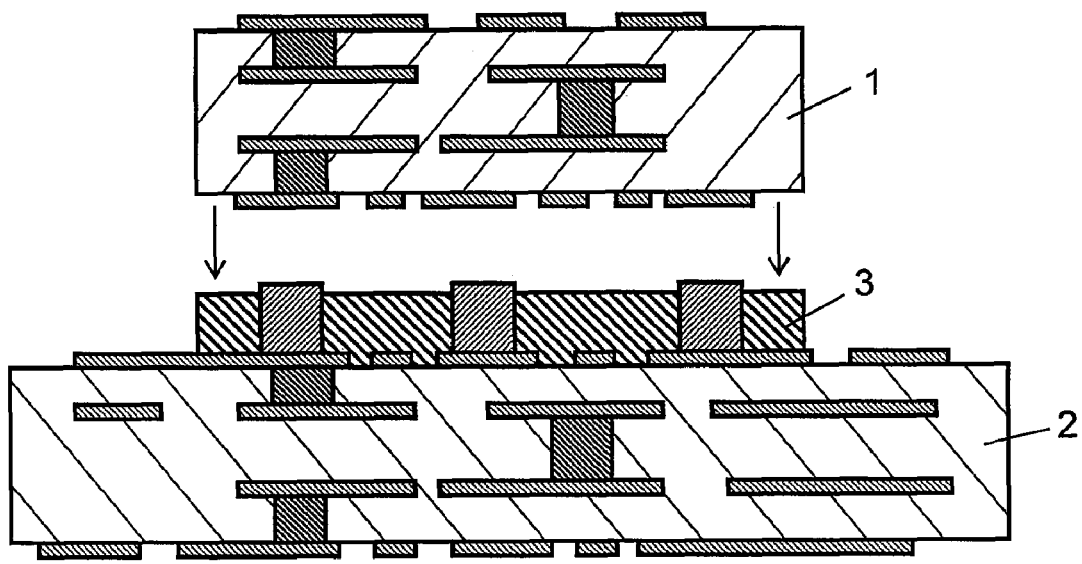
FIG. 4A is a sectional view of an upper printed circuit board and the lower printed circuit board of the solid printed circuit board according to Embodiment 1 of the invention.
Figure 4B:
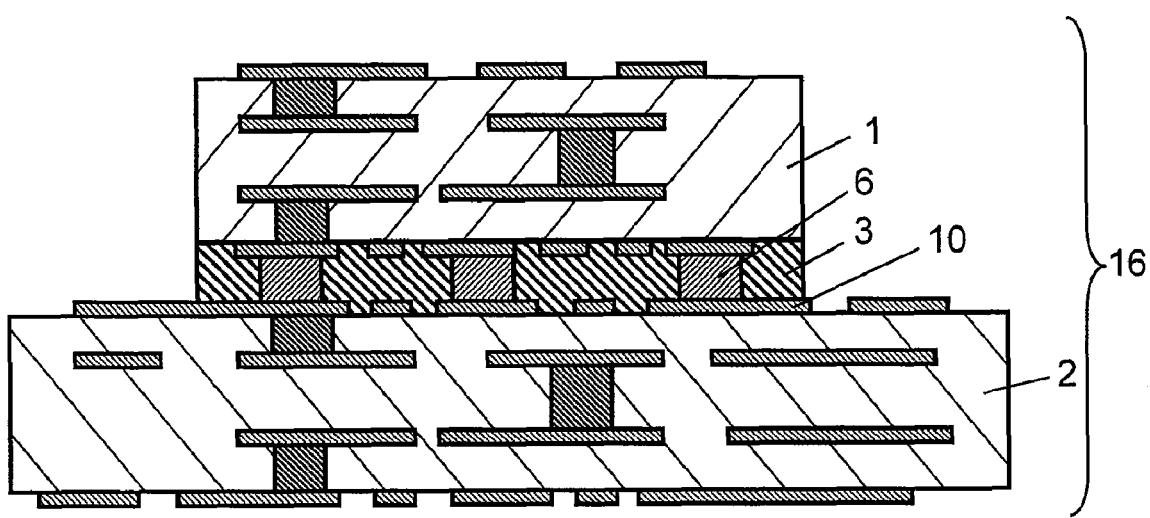
FIG. 4B is a sectional view of the upper printed circuit board and the lower printed circuit board of the solid printed circuit board according to Embodiment 1 of the invention.

FIGS. 4A and 4B are sectional views of upper printed circuit board 1 and lower printed circuit board 2 in the order of manufacturing processes. Subsequent to the process shown in FIG. 3C, upper printed circuit board 1 is placed on bonding layer 3, as indicated by an arrow in FIG. 4A. Then, boards 1 and 2 are stacked by applying heat and pressure, similarly to the process shown in FIG. 3B to provide solid printed circuit board 16, as shown in FIG. 4B. Wirings 10 are embedded in bonding layer 3 during this process of stacking. This process further compresses conductive paste 6 so as to improve connection with wirings 10.

According to this embodiment, upper printed circuit board 1 is placed after bonding layer 3 is placed on lower printed circuit board 2. However, these processes may be reversed so that upper printed circuit board 1 and bonding layer 3 are put together before placing lower printed circuit board 2 for lamination.

Figure 5:
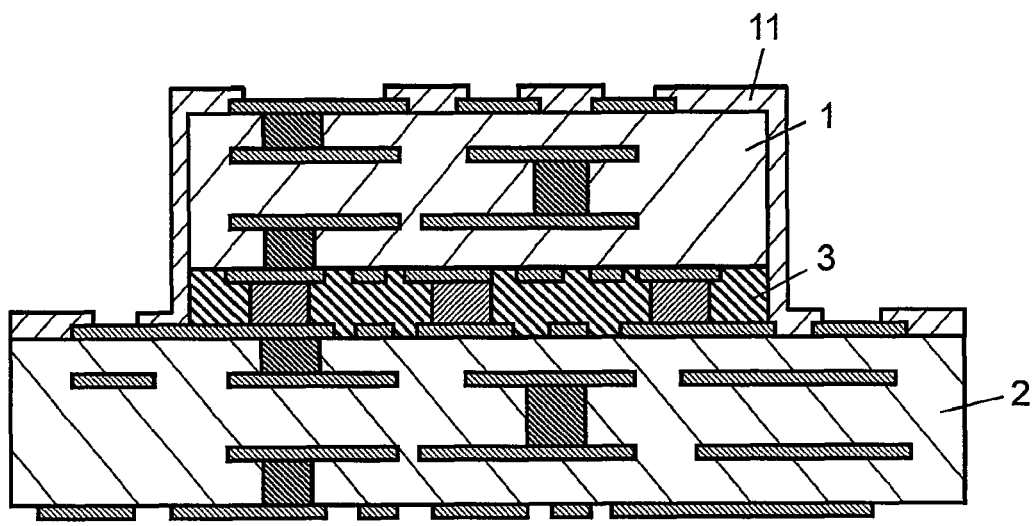
FIG. 5 is a sectional view of the solid printed circuit board according to Embodiment 1 of the invention.

FIG. 5 is a sectional view of the completed solid printed circuit board. Solid printed circuit board having cavities, recesses 4, may have generally collect dust and powder of the board materials at corners of recesses 4. Such dust and powder can be removed easily with a gum roller for dust cleaning if the printed circuit board has a smooth surface without recesses 4. However, it is difficult to remove them from the corners of recesses 4 with the gum roller. It is therefore preferable to take some measures to prevent the dust and powder from collecting in recesses 4, and to avoid troubles in the process of mounting components due to the dust and powder which scatter from upper printed circuit board 1, lower printed circuit board 2, and bonding layer 3 and adhere to recesses 4. That is, the solid printed circuit board according to this invention preferably includes permanent resist 11 which is an insulation coating of dry film having a thickness ranging from 5 to 30 μm, covering wall surfaces of upper printed circuit board 1, lower printed circuit board 2, and bonding layer 3, as shown in FIG. 5. Permanent resist 11 prevents powder and dust from collecting especially in the corners of recesses 4. In this case, however, the coating may not become effective if the thickness of permanent resist 11 is less than 5 μm since it is likely to have pinholes, or the coating may not adhere closely to the surface of the circuit board if the thickness exceeds 30 μm. Permanent resist 11 preferably contain antistatic agent depending on the purpose of use. The antistatic agent prevents dielectric breakdown of electronic components having low dielectric strengths by discharging static electricity when it is used to cover a circuit including such electronic components.

Bonding layer 3 according to this invention may preferably have a thermal expansion coefficient not greater than thermal expansion coefficients of upper printed circuit board 1 and lower printed circuit board 2, or than 65 ppm/° C. at a normal temperature, that is, a temperature below a glass-transition temperature of bonding layer 3.

The solid printed circuit board becomes warped or deformed due to deformation of bonding layer 3 if the thermal expansion coefficient of the bonding layer exceeds 65 ppm/° C. or thermal expansion coefficients of upper printed circuit board 1 and lower printed circuit board 2.

Bonding layer 3 may preferably have a glass-transition temperature (based on the DMA method) not less than 185° C., or higher than glass-transition temperatures of upper printed circuit board 1 and lower printed circuit board 2 by more than 10° C. The glass-transition temperature below 185° C. or the difference less than 10° C. may cause the circuit board tends to warp and deform into a complex shape during such a process as reflow soldering at a temperature higher than the glass-transition temperature.

Bonding layer 3 is made of material not containing any core material, such as woven fabric, unwoven fabric and film. The core material would prevent the wirings from being embedded in the surfaces of the upper and lower printed circuit boards, as discussed above.

Figure 6:
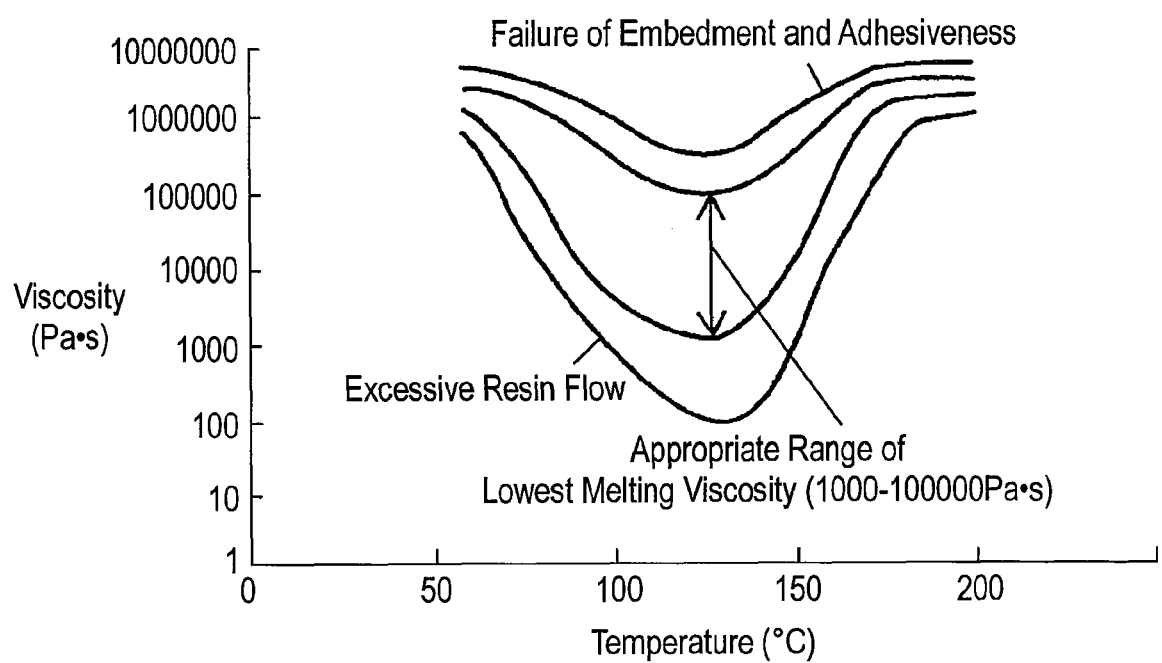
FIG. 6 is a graph illustrating melting viscosities of the bonding layer of the solid printed circuit board according to Embodiment 1 of the invention.

FIG. 6 is a graph showing a melting viscosity of the bonding layer varying against the temperature of the solid printed circuit board according to Embodiment 1. Bonding layer 3 containing inorganic filler dispersed in the thermosetting resin generally has a viscosity decreasing gradually as it is heated from a low temperature to a high temperature, and the viscosity reaches the lowest point at about 130° C. When the temperature is further raised, the viscosity starts increasing again. The graph shows characteristic curves of four different materials. One of the materials represented by the lowermost curve has the lowest melting viscosity of about 100 Pa·s, which is lower than 1,000 Pa·s. Material having a viscosity lower than 1,000 Pa·s causes the resin to flow excessively, and may accordingly allow the resin to flow into recesses 4. Material indicated by the uppermost curve exhibits the lowest melting viscosity of about 300,000 Pa·s, which exceeds 100,000 Pa·s. This material may prevent the resin from adhere sufficiently onto the printed circuit board and may wirings 10 from being embedded. Material having a viscosity with a range between the two inner curves is thus considered suitable. That is, the viscosity ranging from 1,000 to 100,000 Pa·s is appropriate, as shown in the melting viscosity curves shown in FIG. 6.

Bonding layer 3 may contain coloring agent that can improve the mountability and optical reflection.

Bonding layer 3 contains elastomer for controlling flow of the insulating material, that is, to prevent the insulating material from flowing into recesses 4.

Upper printed circuit board 1 and lower printed circuit board 2 may employ resin substrates, such as through-hole circuit boards and circuit boards of all-layer IVH structure. The circuit boards may be either double-sided circuit boards or multilayered circuit boards. Printed circuit boards and bonding layers may be stacked alternately.

Figure 7A:
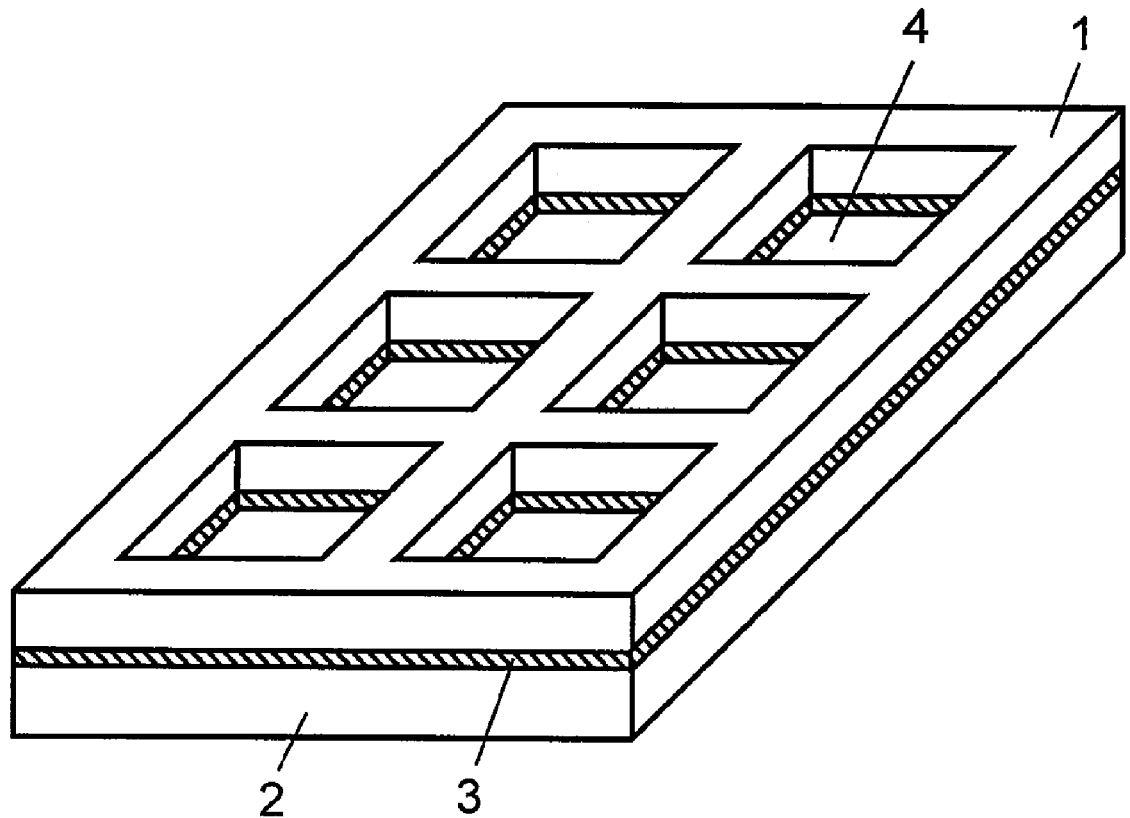
FIG. 7A is a perspective view of another solid printed circuit board according to Embodiment 1 of the invention.
Figure 7B:
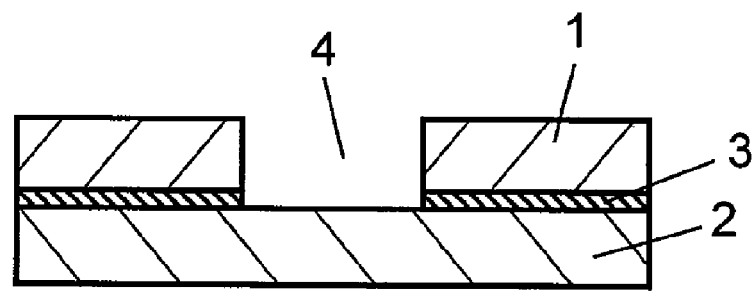
FIG. 7B is a sectional view of the solid printed circuit board according to Embodiment 1 of the invention.

According to Embodiment 1, in FIG. 1A, upper printed circuit board 1 has a floating-island shape having an outer size smaller than that of lower printed circuit board 2. However, both circuit boards may have the same outer sizes and shapes. FIG. 7A is a perspective view of another solid printed circuit board according to Embodiment 1 of the invention. FIG. 7B is a sectional view of a portion of the circuit board. As shown in FIGS. 7A and 7B, two circuit boards having the same outer shapes, and predetermined portions of upper printed circuit board 1 are take out to form recesses 4. In this structure, upper printed circuit board 1 has an area smaller than that of lower printed circuit board 2.

Exemplary Embodiment 2

Figure 8:
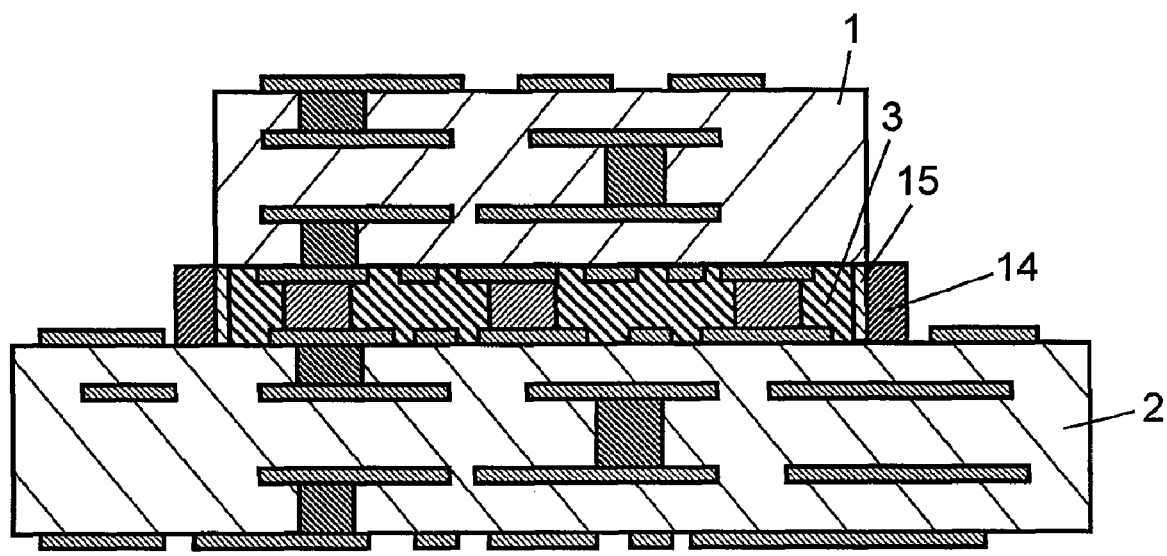
FIG. 8 is a sectional view of a solid printed circuit board according to Exemplary Embodiment 2 of the invention.

Exemplary Embodiment 2 of this invention will be described with reference to accompanying drawings. A basic structure of this embodiment is similar to that of Embodiment 1 shown in FIG. 1A Solid printed circuit board 16 according to this embodiment will be described in detail with reference to FIG. 8. FIG. 8 is a sectional view of solid printed circuit board 16 according to this embodiment. According to this exemplary embodiment, solder resist 14 is formed on a peripheral edge of the bonding layer 3, as shown in FIG. 8. Bonding layer 3 of the solid printed circuit board has an area smaller than that of upper printed circuit board 1, and solder resist 14 on the peripheral edge of bonding layer 3 protrudes from a surface of lower printed circuit board 2. Bonding layer 3 has the area smaller than that of upper printed circuit board 1, and provides a space for storing flow-out resin 15 flowing from bonding layer 3 produced in the process of hot press. Solder resist 14 protruding on the surface of lower printed circuit board 2 functions as a stopper for blocking flow-out resin 15 exuding from bonding layer 3 during the process of hot press, thereby preventing flow-out resin 15 from contaminating wirings formed on the surface of lower printed circuit board 2. Solder resist 14 may be formed entirely on a portion of the surface of lower printed circuit board 2 exposed. Another solder resist may be formed to cover the side wall of upper printed circuit board 1 and solder resist 14 after upper printed circuit board 1, bonding layer 3, and lower printed circuit board 2 are stacked.

Figure 9A:
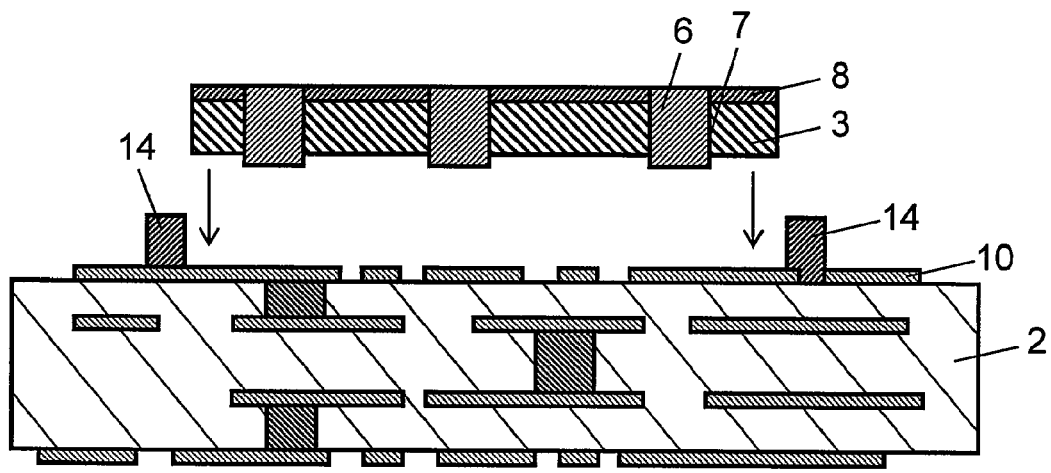
FIG. 9A is a sectional view of a bonding layer and a lower printed circuit board of the solid printed circuit board according to Embodiment 2 of the invention.
Figure 9B:
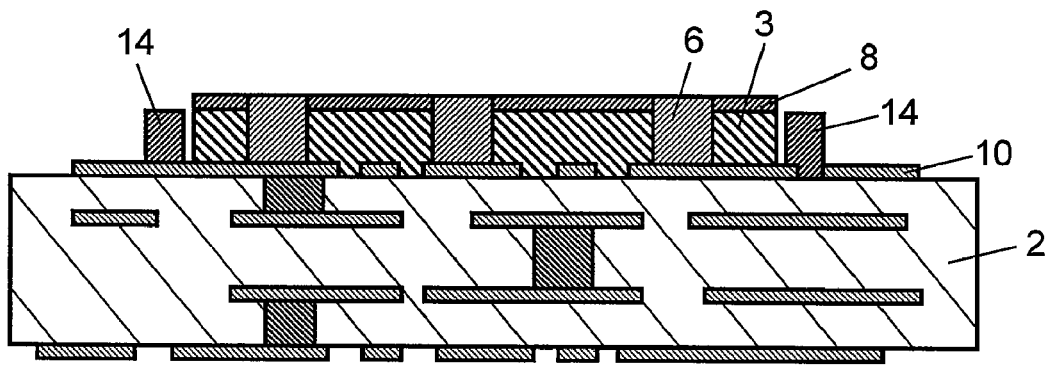
FIG. 9B is a sectional view of the bonding layer and the lower printed circuit board of the solid printed circuit board according to Embodiment 2 of the invention.
Figure 9C:
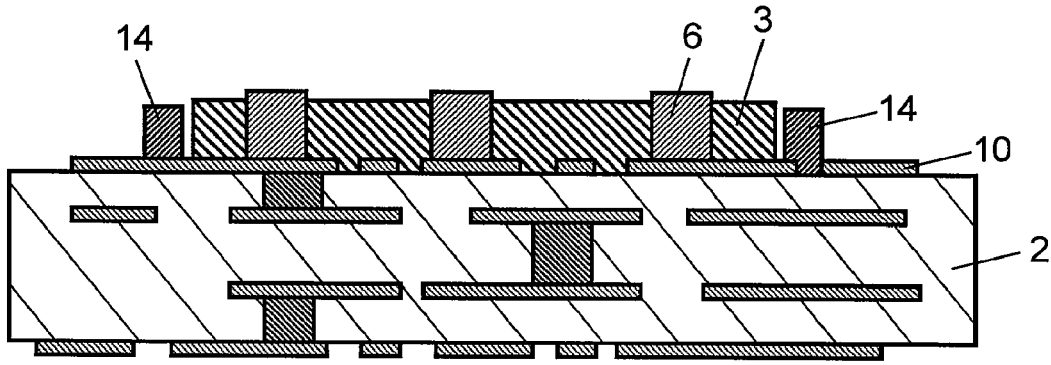
FIG. 9C is a sectional view of the bonding layer and the lower printed circuit board of the solid printed circuit board according to Embodiment 2 of the invention.

Next, a method of manufacturing the solid printed circuit board according to Embodiment 1 will be described. Bonding layer 3 is produced by the same method shown in FIGS. 2A to 2D. FIGS. 9A, 9B and 9C are sectional views of bonding layer 3 and lower printed circuit board 2 shown in the order of the manufacturing processes. In a process subsequent to that shown in FIG. 2D, bonding layer 3 is placed on a predetermined position on lower printed circuit board 2, as indicated by an arrow in FIG. 9A. According to this embodiment, solder resist 14 is formed in advance on a periphery of a position where bonding layer 3 is formed, as shown in FIG. 9A. In addition, conductive paste 6 is temporarily fixed on wirings 10 formed on lower printed circuit board 2, as shown in FIG. 9B. At this moment, wirings 10 are embedded in bonding layer 3. This process compresses conductive paste 6, improving connection with wirings 10. Then, PET film 8 left on the surface is peeled off, as shown in FIG. 9C.

Figure 10A:
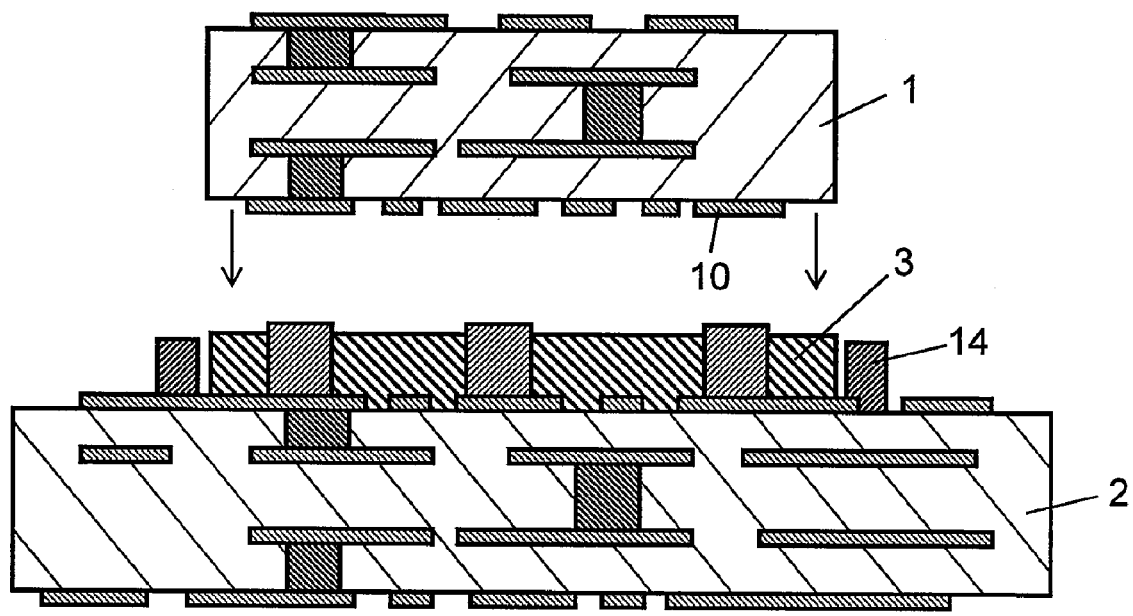
FIG. 10A is a sectional view of an upper printed circuit board and the lower printed circuit board of the solid printed circuit board according to Embodiment 2 of the invention.
Figure 10B:
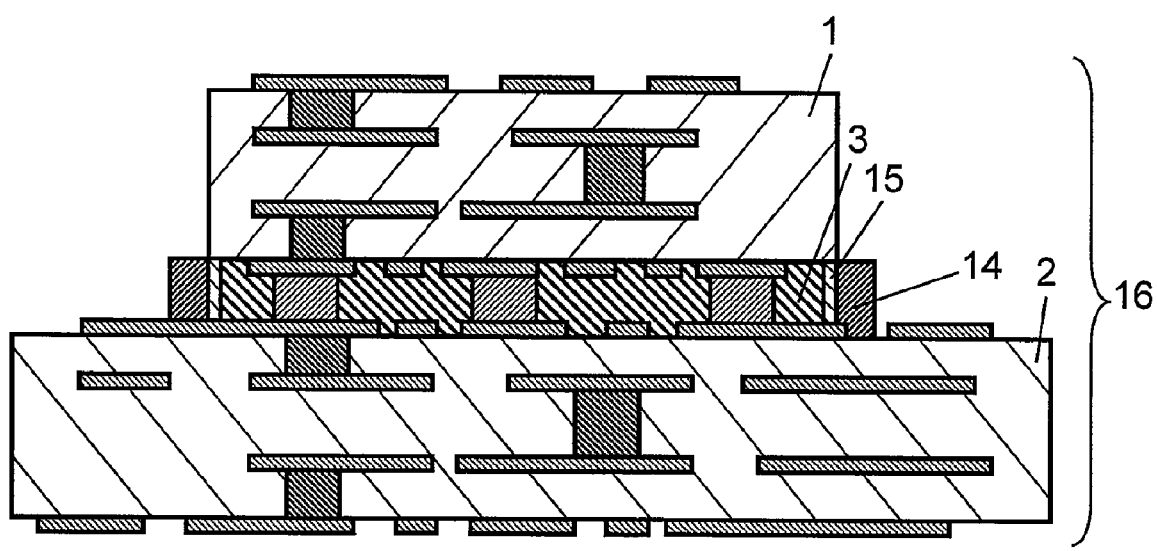
FIG. 10B is a sectional view of the upper printed circuit board and the lower printed circuit board of the solid printed circuit board according to Embodiment 2 of the invention.

FIGS. 10A and 10B are sectional views of upper printed circuit board 1 and lower printed circuit board 2 shown in the order of the manufacturing processes. Subsequent to the process shown in FIG. 9C, upper printed circuit board 1 is placed on bonding layer 3, as indicated by an arrow in FIG. 10A, and laminated by applying heat and pressure with hot press. Wirings 10 are embedded in bonding layer 3 during this process of lamination. This process further compresses conductive paste 6 so as to improve connection with wirings 10. Although the process of hot press causes bonding layer 3 to exude flow-out resin 15, solder resist 14 prevents flow-out resin 15 from exuding, thereby avoid contamination of wirings 10 on the surface of lower printed circuit board 2. Solid printed circuit board 16 is completed, as shown in FIG. 10B.

Figure 11A:
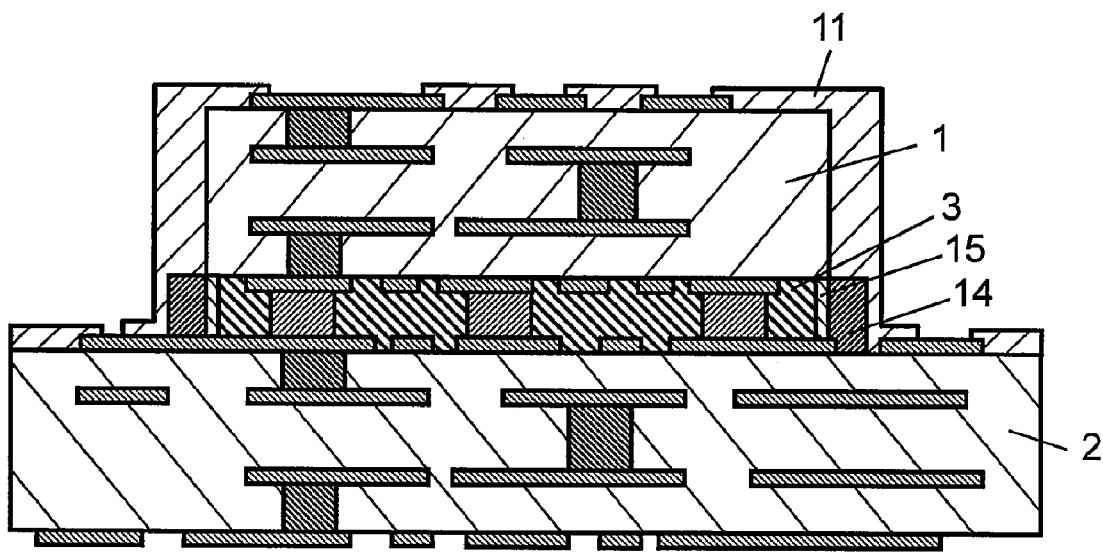
FIG. 11A is a sectional view of another solid printed circuit board according to Embodiment 2 of the invention.

FIG. 11A is a sectional view of another solid printed circuit board according to Embodiment 2 of this invention. Permanent resist 11 of dry film having a thickness ranging from 5 to 30 μm as an insulation coating may be preferably put on the wall surfaces of upper printed circuit board 1, lower printed circuit board 2, and solder resist 14, as shown in FIG. 11A.

Figure 11B:
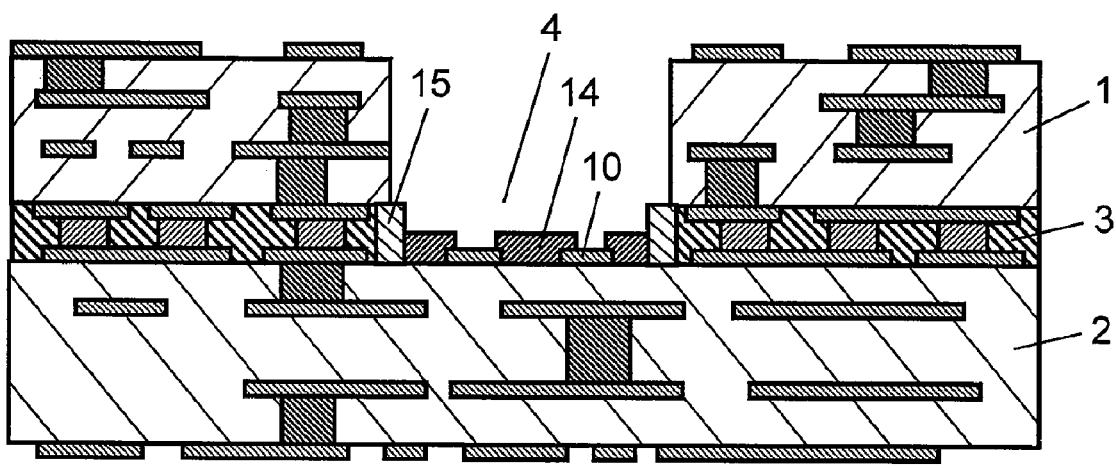
FIG. 11B is a sectional view of still another solid printed circuit board according to Embodiment 2 of the invention.

FIG. 11B is a sectional view of still another solid printed circuit board according to this embodiment. According to the present invention, solder resist 14 is formed on the surface area within recess 4 formed by lamination of upper printed circuit board 1 and lower printed circuit board 2, as shown in FIG. 11B. Since solder resist 14 does not have a rough surface, a removable sheet used for forming the solid printed circuit board 16 by stacking upper printed circuit board 1, lower printed circuit board 2 and bonding layer 3 can be peeled of without having fragments of the sheet remaining in recesses 4.

Bonding layer 3 has a smaller area than upper printed circuit board 1. This configuration can provide a space for storing flow-out resin 15 exuding from bonding layer 3 in the process of hot press, and solder resist 14 functions as a stopper for blocking flow-out resin 15. This prevents flow-out resin 15 from contaminating the wirings formed on the surface of lower printed circuit board 2. In FIG. 11B, solder resist 14 is formed in an area inside recesses 4, however, may be formed beyond recesses 4, that is, solder resist 14 may spread out of the area where bonding layer 3 is actually formed.

Solder resist 14 shown in FIG. 11B is formed inside recesses 4 to cover at least the areas where wirings 10 are not formed. According to this invention, however, solder resist 14 may be formed entirely on an area of the upper surface including the areas where wirings 10 are formed. Another layer of solder resist may be formed to cover the side wall of upper printed circuit board 1 after upper printed circuit board 1, bonding layer 3, and lower printed circuit board 2 are stacked.

Figure 11C:
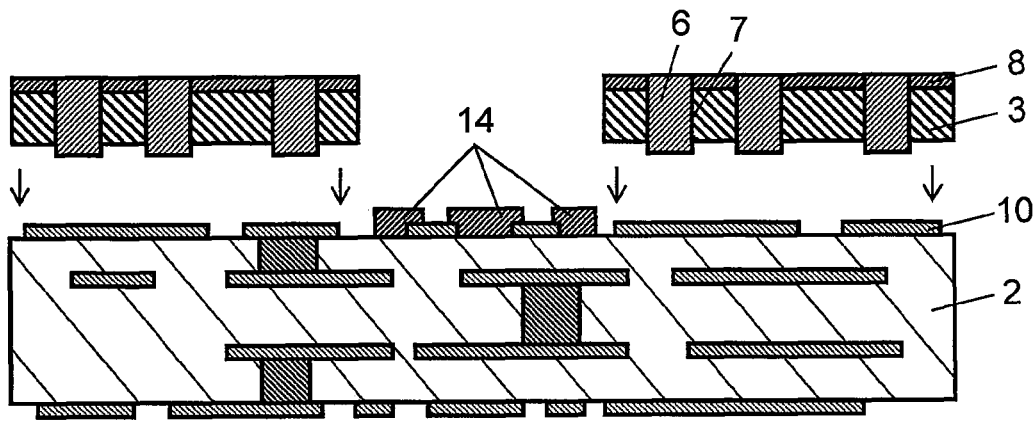
FIG. 11C is a sectional view of a bonding layer and a lower printed circuit board of the solid printed circuit board according to Embodiment 2 of the invention.
Figure 11D:
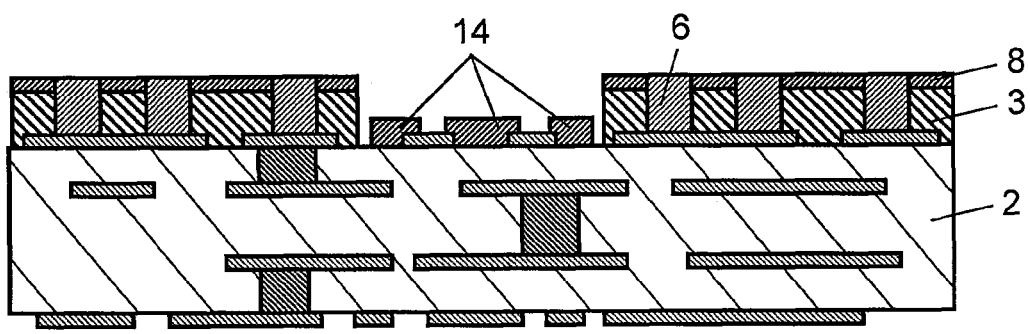
FIG. 11D is a sectional view of the bonding layer and the lower printed circuit board of the solid printed circuit board according to Embodiment 2 of the invention.
Figure 11E:
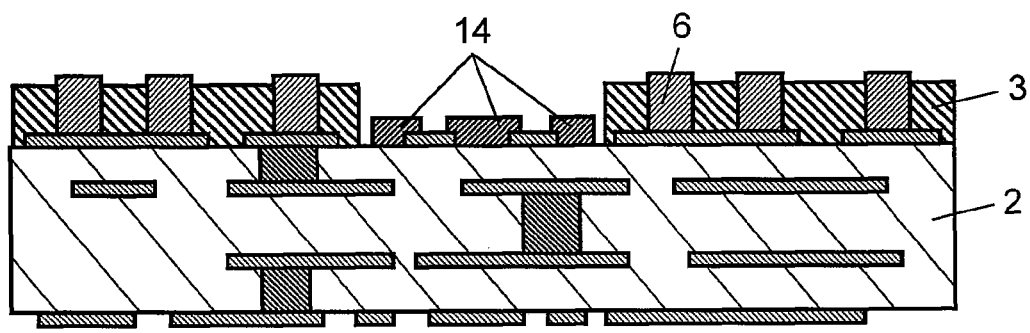
FIG. 11E is a sectional view of the bonding layer and the lower printed circuit board of the solid printed circuit board according to Embodiment 2 of the invention.

A method of manufacturing the solid printed circuit board according to this embodiment will be described below. Bonding layer 3 is produced by the method shown in FIGS. 2A, 2B, 2C and 2D. FIGS. 11C, 11D and 11E are sectional views of bonding layer 3 and lower printed circuit board 2 shown in the order of the manufacturing processes. In a process subsequent to that shown in FIG. 2D, bonding layer 3 is placed on a proper position on lower printed circuit board 2, as indicated by an arrow in FIG. 11C. Prior to this process, solder resist 14 is formed on lower printed circuit board 2. Conductive paste 6 is then laid on wirings 10 formed on lower printed circuit board 2 by applying heat and pressure, as shown in FIG. 11D. Wirings 10 are embedded in bonding layer 3 in this process of lamination. Solder resist 14 is formed on the surface of recesses 4, and functions as a stopper for blocking flow-out resin 15 exuding from bonding layer 3. Then, PET film 8 is peeled off, as shown in FIG. 11E.

Figure 11F:
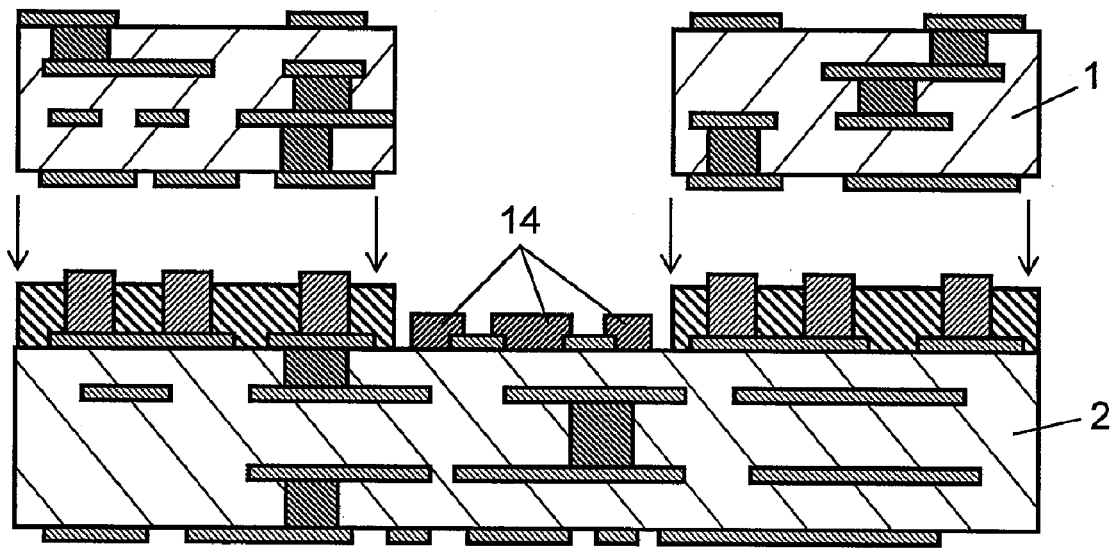
FIG. 11F is a sectional view of an upper printed circuit board and the lower printed circuit board of the solid printed circuit board according to Embodiment 2 of the invention.
Figure 11G:
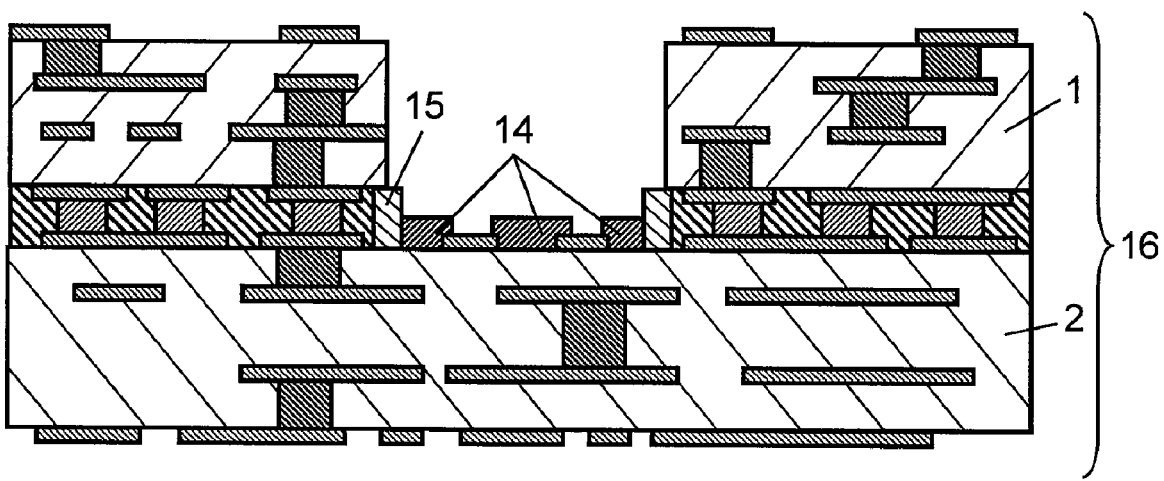
FIG. 11G is a sectional view of the upper printed circuit board and the lower printed circuit board of the solid printed circuit board according to Embodiment 2 of the invention.

FIGS. 11F and 11G are sectional views of upper printed circuit board 1 and lower printed circuit board 2 shown in the order of the manufacturing processes. In a process subsequent to that shown in FIG. 11E, upper printed circuit board 1 is placed on bonding layer 3, as indicated by an arrow in FIG. 11F. Next, the surface of upper printed circuit board 1 is covered entirely with a removable sheet (not shown) for lamination of the boards, and they are laminated by applying heat and pressure with a hot press, as shown in FIG. 11G. After the lamination, the removable sheet is peeled off from the board. Solder resist 14 formed on the bottom of recesses 4 of lower printed circuit board 2 doe not have a rough surface, the removable sheet can be removed easily without having fragments of the sheet remain in recesses 4. Although the process of hot press causes bonding layer 3 to exude flow-out resin 15, solder resist 14 prevents flow-out resin 15 from being spread. Solder resist 14 avoids contamination of wirings 10 on the surface of recesses 4 since solder resist 14 prevents dust and particles scattered out of upper printed circuit board 1, lower printed circuit board 2, and bonding layer 3 from collecting inside recesses 4.

Since the removable sheet restricts flow of the insulating material from bonding layer 3, or prevents the insulating material from flowing into recesses 4, the removable sheet has a melting temperature higher than that of bonding layer 3, and covers along the surface of the boards in order to stop the flow of the insulating material from bonding layer 3 during the pressing process. Bonding layer 3 may preferably contains elastomer.

Bonding layer 3 according to this invention may preferably has a thermal expansion coefficient not greater than that of each of upper printed circuit board 1 and lower printed circuit board 2, or than 65 ppm/° C., similar to Embodiment 1.

Bonding layer 3 may preferably have a glass-transition temperature (based on the DMA method) not less than 185° C., or higher than that of each upper printed circuit board 1 and lower printed circuit board 2 by more than 10° C.

Bonding layer 3 may be preferably made of material which does not contain a core material, such as woven fabric, unwoven fabric, or film.

Bonding layer 3 has a lowest melting viscosity ranging from 1,000 to 100,000 Pa·s, as shown in the melting viscosity curves of FIG. 6.

Figure 12A:
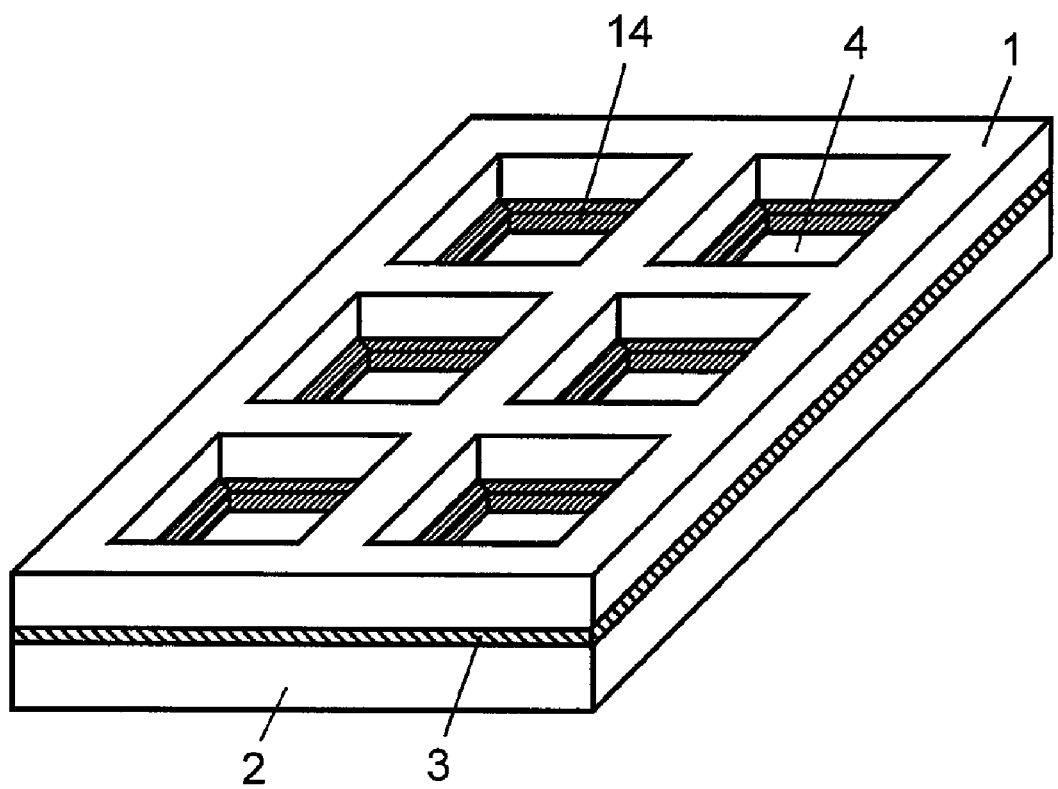
FIG. 12A is a perspective view of another solid printed circuit board according to Embodiment 2 of the invention.
Figure 12B:
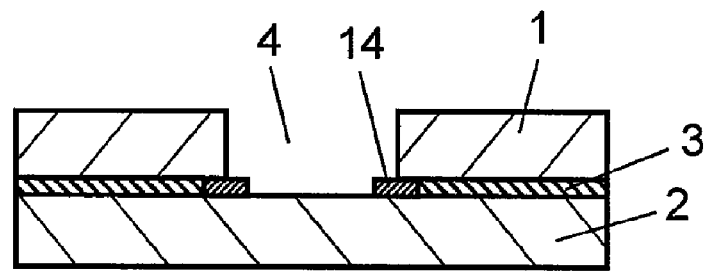
FIG. 12B is a sectional view of the solid printed circuit board according to Embodiment 2 of the invention.

Similarly, bonding layer 3 may preferably contain coloring agent. FIG. 12A is a perspective view of another solid printed circuit board according to Embodiment 2 of this invention. FIG. 12B is a sectional view of a portion of the circuit board. According to this embodiment, recesses 4 may be formed by cutting out predetermined portions of upper printed circuit board 1 having the same outer shape as the other circuit boards, as shown in FIGS. 12.

Exemplary Embodiment 3

Figure 13A:
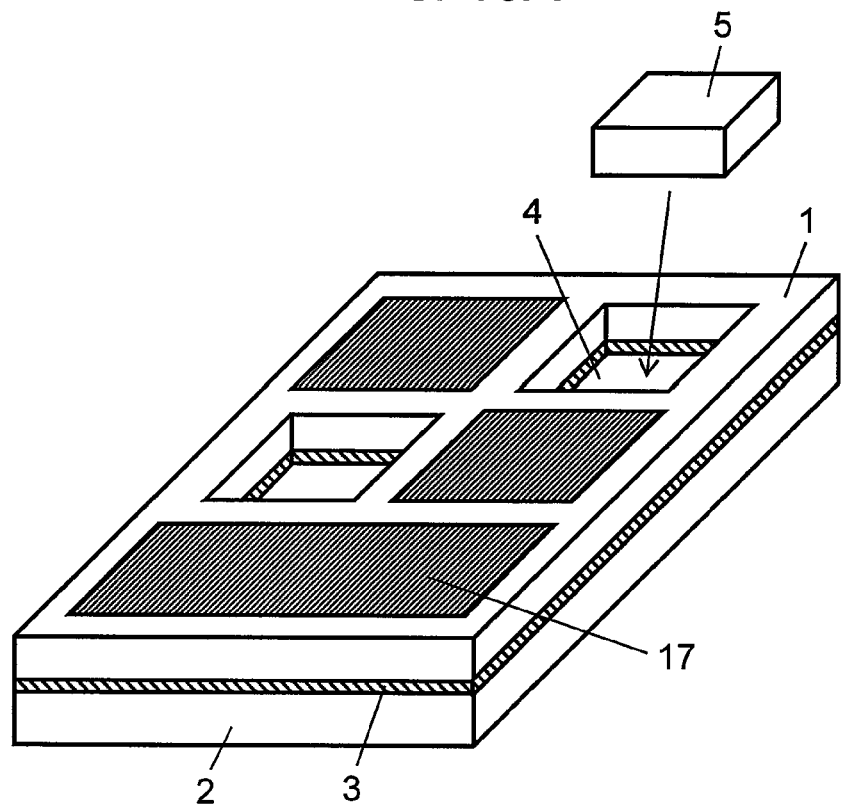
FIG. 13A is a perspective view of a solid printed circuit board according to Exemplary Embodiment 3 of the invention.
Figure 13B:
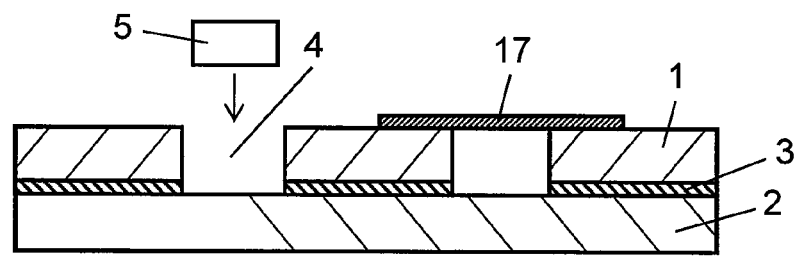
FIG. 13B is a sectional view of the solid printed circuit board according to Embodiment 3 of the invention.
Figure 13C:
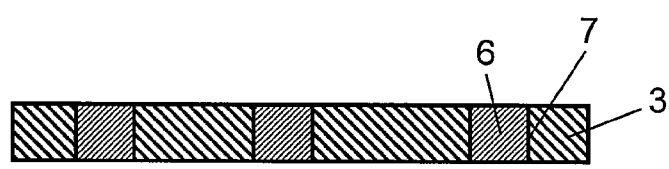
FIG. 13C is a sectional view of a bonding layer of the solid printed circuit board according to Embodiment 3 of the invention.

Exemplary Embodiment 3 of this invention will be described below. FIG. 13A is a perspective view of a solid printed circuit board according to Exemplary Embodiment 3 of this invention. FIG. 13B is a sectional view of the solid printed circuit board according to Embodiment 3. FIG. 13C is a sectional view of a bonding layer of the solid printed circuit board according to Embodiment 3. The structure of this embodiment is generally analogous to that shown in FIGS. 7A and 7B according to the previous embodiment. According to this embodiment, metal film 17 covers upper printed circuit board 1 and recesses 4, as shown in FIGS. 13A and 13B. Metal film 17 covering recesses 4 can protect wirings and electronic components located inside recesses 4 from electromagnetic noises and electrostatic noises from the outside. The metal film may be connected with upper printed circuit board 1 to provide partial shielding. Recesses 4 allow the metal films to be formed on arbitrary positions, thus allowing the circuit board to be designed flexibly.

FIG. 13C is an enlarged sectional view of bonding layer 3 according to this embodiment. Bonding layer 3 is made of insulating material containing inorganic filler dispersed in thermosetting resin. Bonding layer 3 has via-conductors 7 made of through-holes perforated in predetermined locations and filled with conductive paste 6.

Figure 14A:
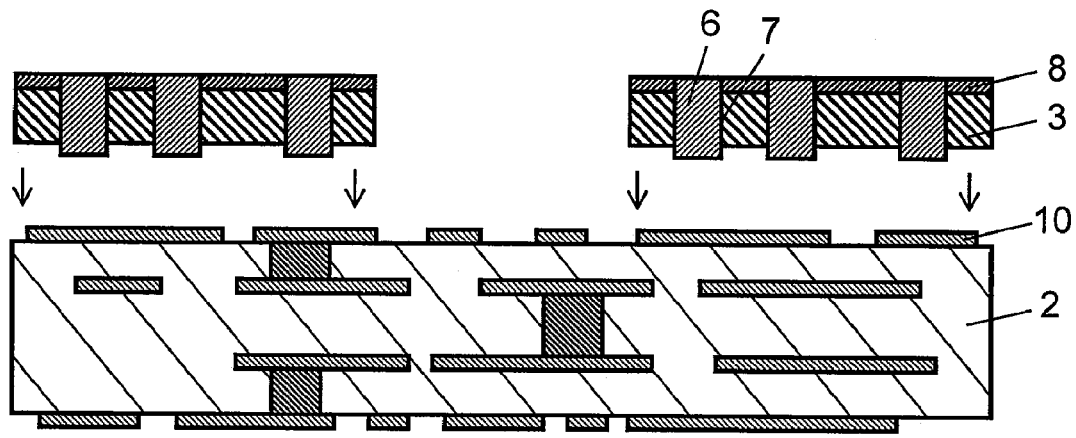
FIG. 14A is a sectional view of the bonding layer and a lower printed circuit board of the solid printed circuit board according to Embodiment 3 of the invention.
Figure 14B:
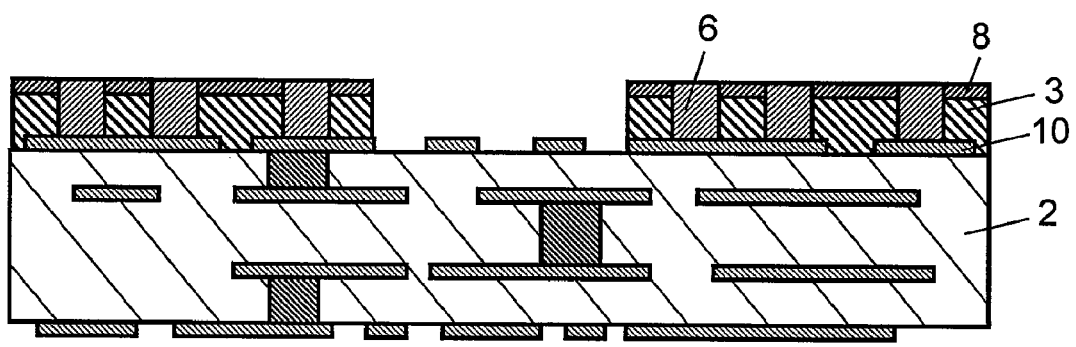
FIG. 14B is a sectional view of the bonding layer and the lower printed circuit board of the solid printed circuit board according to Embodiment 3 of the invention.
Figure 14C:
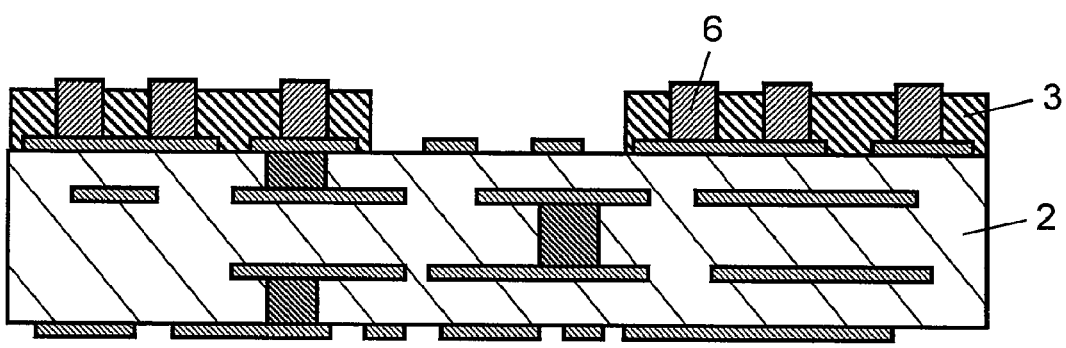
FIG. 14C is a sectional view of the bonding layer and the lower printed circuit board of the solid printed circuit board according to Embodiment 3 of the invention.

A method of manufacturing the solid printed circuit board according to this embodiment will be described below. Bonding layer 3 is produced by the method described shown in FIGS. 2A, 2B, 2C and 2D. FIGS. 14A, 14B and 14C are sectional views of bonding layer 3 and lower printed circuit board 2 shown in the order of the manufacturing steps. In a process subsequent to that shown in FIG. 2D, bonding layer 3 is placed on a predetermined position on lower printed circuit board 2, as indicated by an arrow in FIG. 14A. Conductive paste 6 is temporarily fixed over wirings 10 formed on lower printed circuit board 2, as shown in FIG. 14B. Then, PET film 8 left intact on the surface is peeled off, as shown in FIG. 14C.

Figure 15A:
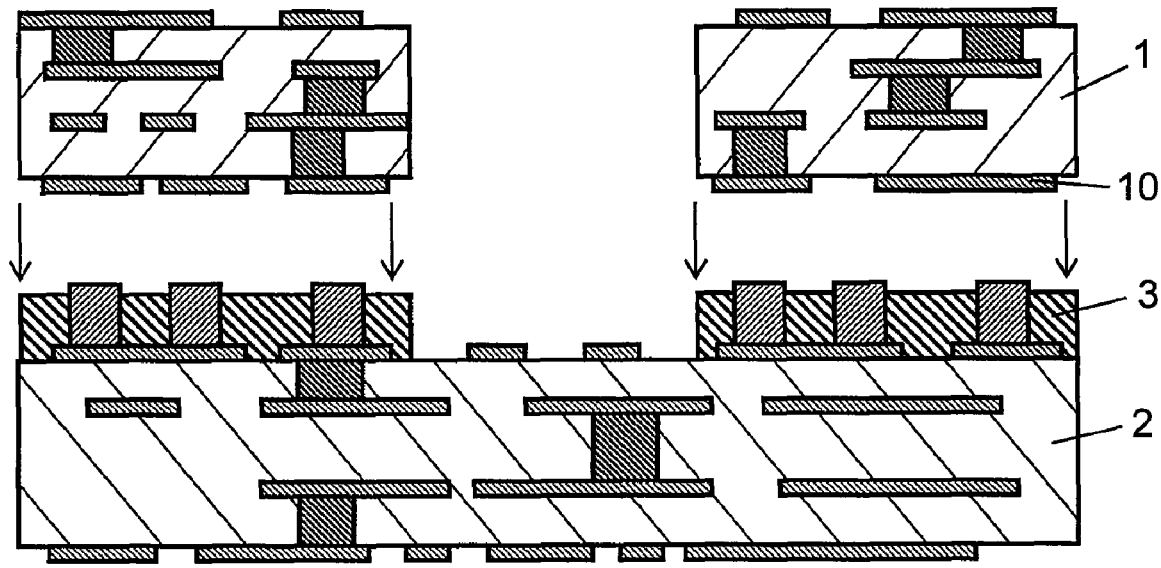
FIG. 15A is a sectional view of an upper printed circuit board and the lower printed circuit board of the solid printed circuit board according to Embodiment 3 of the invention.
Figure 15B:
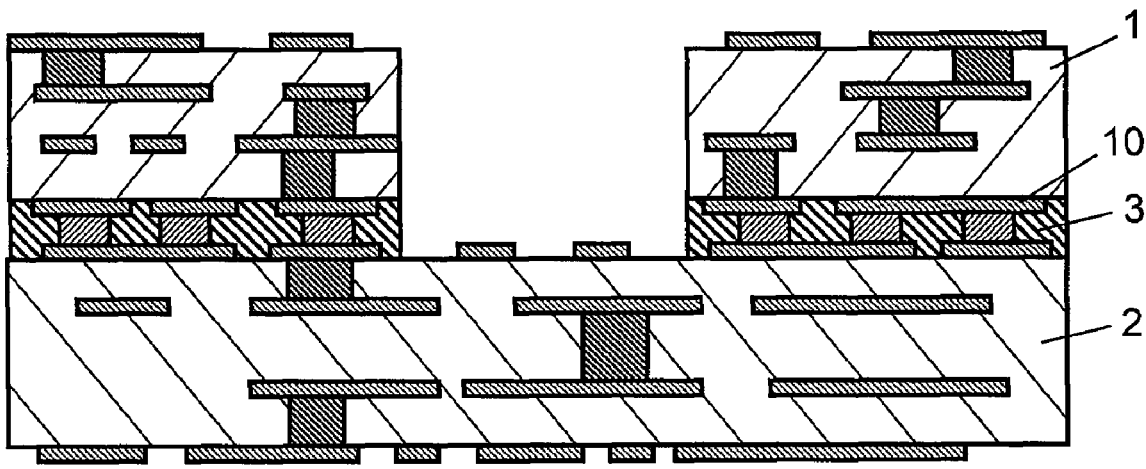
FIG. 15B is a sectional view of the upper printed circuit board and the lower printed circuit board of the solid printed circuit board according to Embodiment 3 of the invention.

FIGS. 15A and 15B are sectional views of upper printed circuit board 1 and lower printed circuit board 2 shown in the order of the manufacturing steps. In a process subsequent to the step shown in FIG. 14C, upper printed circuit board 1 is placed on bonding layer 3, as indicated by an arrow in FIG. 15A. They are laminated by applying heat and pressure to complete solid printed circuit board 16 as shown in FIG. 15B.

Figure 16:
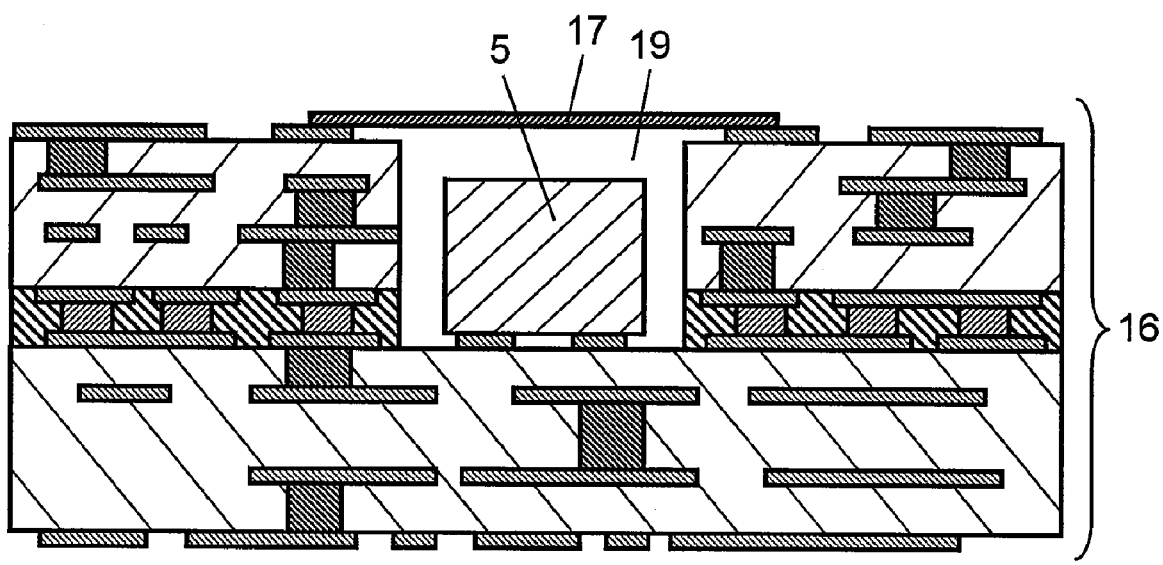
FIG. 16 is a sectional view of the solid printed circuit board according to Embodiment 3 of the invention.

FIG. 16 is a sectional view of solid printed circuit board 16 according to Embodiment 3. Component 5 is mounted inside recess 4, as shown in FIG. 16, and recess 4 is filled with potting resin 19. A surface of resin 19 is then plated to form metal film 17, providing solid printed circuit board 16 according to this invention.

This structure ensures the rigidity of solid printed circuit board 16 even if lower printed circuit board 2 is made of a thin board, such as a film board, and easily provides a partial shield with metal film 17 connected with upper printed circuit board 1. Metal film 17 may alternatively be formed by putting metallic foil on upper printed circuit board 1. In this case, potting resin 19 may not necessarily be formed.

As described above, metal film 17 can cover and shield any of recesses 4 for protection of wirings and electronic components mounted inside thereof from electromagnetic noises and electrostatic noises. Solid printed circuit board 16 shielded in this manner has an advantage of high immunity to the external noises.

Exemplary Embodiment 4

Figure 17A:
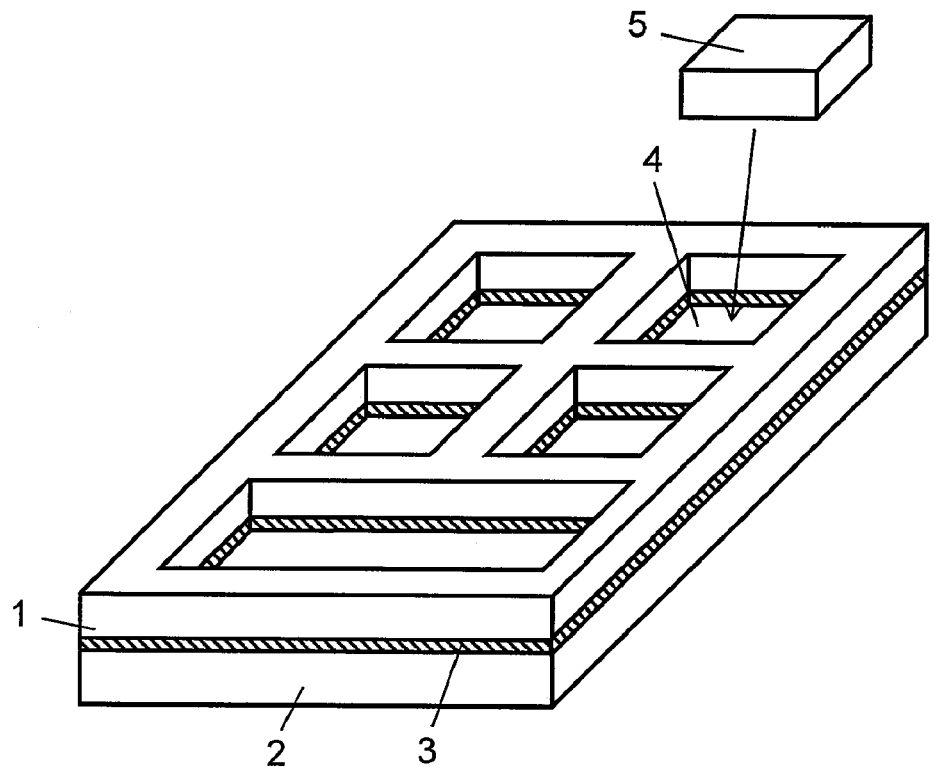
FIG. 17A is a perspective view of a solid printed circuit board according to Exemplary Embodiment 4 of the invention.

FIG. 17A is a perspective view of a solid printed circuit board according to Exemplary Embodiment 4 of this invention. A basic structure of this embodiment is similar to that according to Embodiment 1. The same components are denoted by the same reference numerals. The solid printed circuit board according to this embodiment includes upper printed circuit board 1, lower printed circuit board 2, and bonding layer 3. Upper printed circuit board 1 and lower printed circuit board 2 have different shapes from each other and have wirings formed on the surfaces thereof. Upper printed circuit board 1 and lower printed circuit board 2 have different shapes, and form recesses 4 defining cavities, as shown in FIG. 17A. Bonding layer 3 has a thickness ranging preferably from 30 and 300 μm, and more preferably from 30 to 250 μm.

Figure 17B:
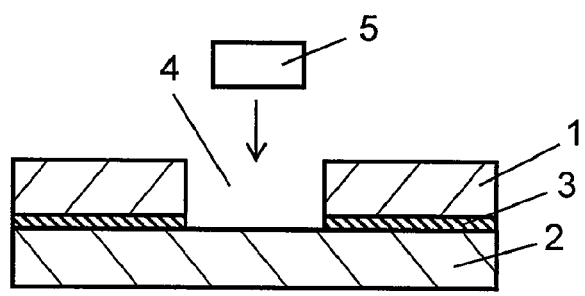
FIG. 17B is a sectional view of the solid printed circuit board according to Embodiment 4 of the invention.

FIG. 17B is a sectional view of the solid printed circuit board according to Embodiment 4 of this invention. Components 5 are mounted into recesses 4 to reduce an overall thickness as a packaged unit, as shown in FIG. 17B, providing a thickness smaller than 400 μm. According to this invention, upper printed circuit board 1 has a frame shape provided on a portion of lower printed circuit board 2 in order to add a physical strength to the circuit board unit. Incidentally, upper printed circuit board 1 may be formed on a portion of lower printed circuit board 2, as shown in FIG. 17B, or may be formed entirely on a surface of lower printed circuit board 2, as shown in FIG. 17A. According to this embodiment, upper printed circuit board 1 is made of material having strength necessary to maintain the frame shape, and may be made of a printed circuit board. In this case, the circuit board may have wirings, and may not have the wirings. The circuit board may have via-conductors or may not have the via-conductors when used as the frame.

Figure 17C:
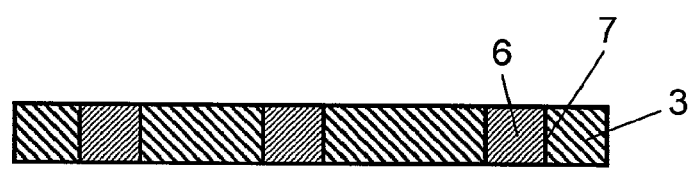
FIG. 17C is a perspective view of a bonding layer of the solid printed circuit board according to Embodiment 4 of the invention.

FIG. 17C is an enlarged sectional view of bonding layer 3 according to this embodiment. Bonding layer 3 is made of insulating material containing thermosetting resin and inorganic filler dispersed therein, and has via-conductors 7 made of conductive pastes 6 filling through-holes perforated therein.

A method of manufacturing the solid printed circuit board according to this embodiment will be described in detail below. Bonding layer 3 is produced by the method as described with reference to FIGS. 2A, 2B, 2C and 2D. This manufacturing method is also applied to the fixing of bonding layer 3 and lower printed circuit board 2, as discussed in Embodiment 1. That is, the manufacturing method is the same as that illustrated in FIGS. 14A, 14B and 14C discussed in Embodiment 3.

Figure 18A:
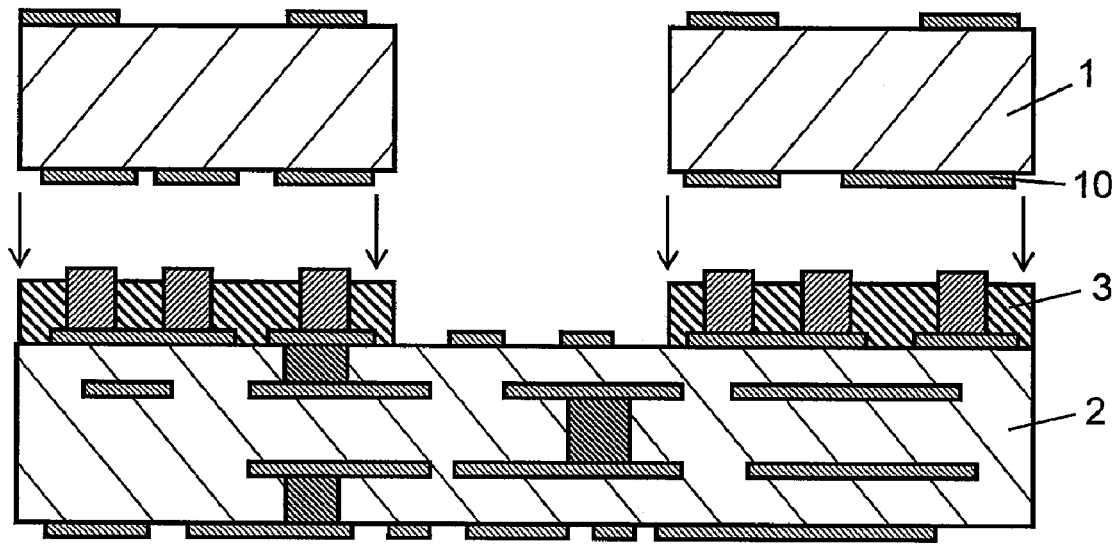
FIG. 18A is a sectional view of an upper printed circuit board and a lower printed circuit board of the solid printed circuit board according to Embodiment 4 of the invention.
Figure 18B:
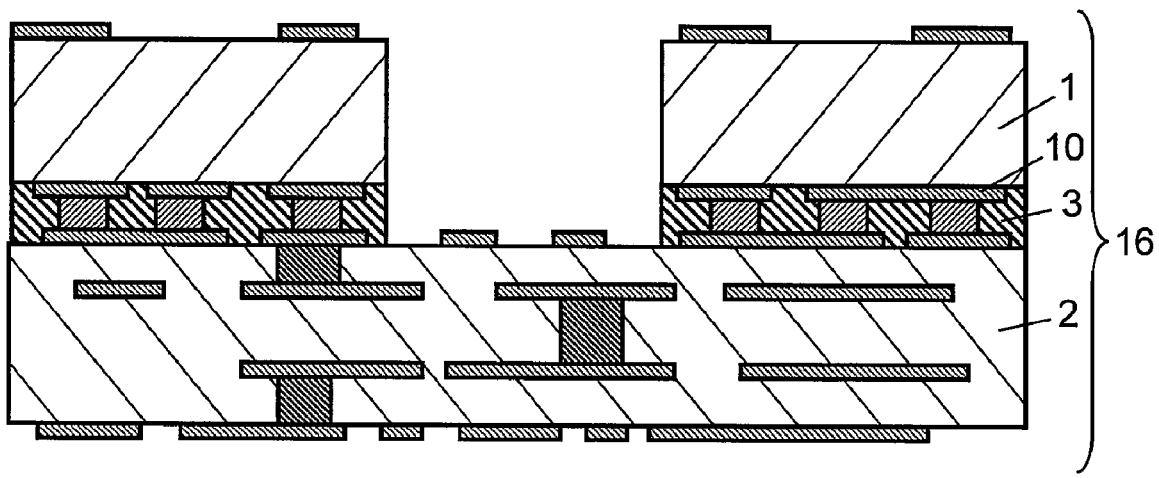
FIG. 18B is a sectional view of the upper printed circuit board and the lower printed circuit board of the solid printed circuit board according to Embodiment 4 of the invention.

FIGS. 18A and 18B are sectional views of upper printed circuit board 1 and lower printed circuit board 2 shown in the order of the manufacturing processes. Upper printed circuit board 1 having the frame shape is previously placed on a portion of bonding layer 3, as shown in FIG. 18A, and then, the circuit boards 1 and 3 are laminated by applying heat and pressure to complete solid printed circuit board 16, as shown in FIG. 18B. Wirings 10 are embedded in bonding layer 3 during this lamination process. This process further compresses conductive paste 6 so as to improve connection with wirings 10.

Upper printed circuit board 1 having the frame shape placed on the portion of lower printed circuit board 2 provides the solid printed circuit board according to this invention with rigidity even if an overall thickness of the circuit board is less than 400 μm.

Bonding layer 3 according to this invention preferably has a thermal expansion coefficient not greater than that of each of upper printed circuit board 1 and lower printed circuit board 2, or than 65 ppm/° C., similarly to the previous embodiments.

Bonding layer 3 preferably may have a glass-transition temperature (based on the DMA method) which is not less than 185° C., or which is higher than that of each of upper printed circuit board 1 and lower printed circuit board 2 by more than 10° C.

Bonding layer 3 may preferably be made of material not containing any core material, such as woven fabric, unwoven fabric, or film.

Bonding layer 3 may preferably have the lowest melting viscosity ranging from 1,000 to 100,000 Pa·s, as shown in the melting viscosity curves of FIG. 6.

Figure 19:
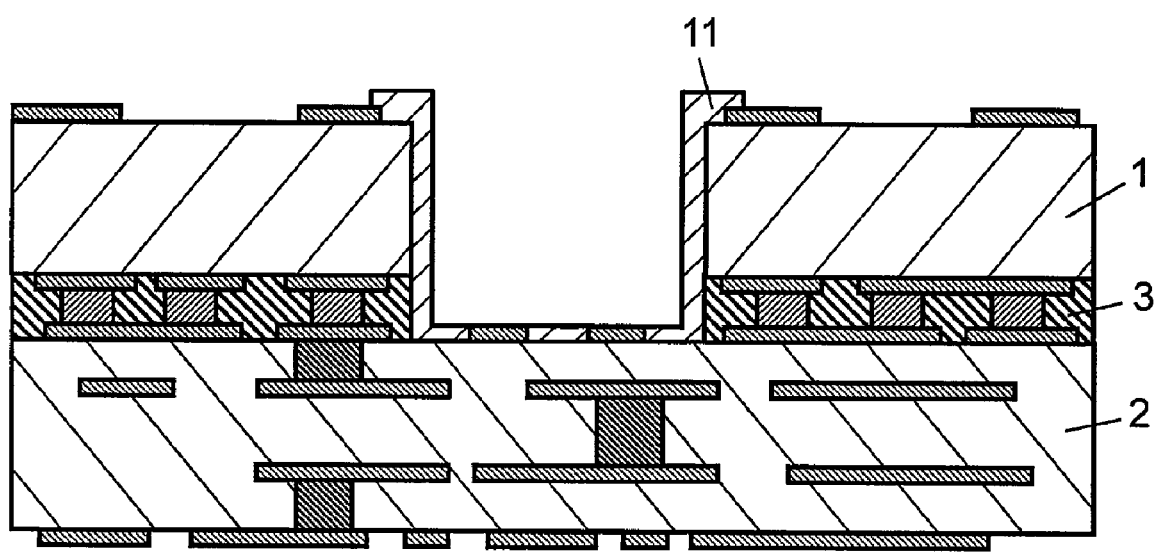
FIG. 19 is a sectional view of the solid printed circuit board according to Embodiment 4 of the invention.

Bonding layer 3 may preferably contain coloring agent. FIG. 19 is a sectional view of the solid printed circuit board according to Embodiment 4 of this invention. Circuit boards having cavities or recesses may cause dust and powder of substrate materials to collect at corners of the recesses. Such dust and powder can be removed easily with a gum roller for dust cleaning if the printed circuit board has a smooth surface without the recesses. However, it is difficult to remove the duct and powder from the corners of the recesses with the gum roller. The solid printed circuit board according to this invention may preferably include permanent resist 11 of dry film having a thickness ranging from 5 to 30 μm, to cover wall surfaces of upper printed circuit board 1, lower printed circuit board 2, and bonding layer 3, as shown in FIG. 19 in order to prevent the dust and powder from collecting in recesses 4, and to avoid troubles in mounting components due to the dust and powder scattered from upper printed circuit board 1, lower printed circuit board 2, and bonding layer 3 and adhered to recesses 4. This structure can thus prevent the dust and powder from collecting especially in the corners of recesses 4. Permanent resist 11 having a thickness less than 5 μm may have pinholes therein, thus being prevented from covering the walls sufficiently. Permanent resist 11 having a thickness exceeding 30 μm may not adhere closely to the surface of the circuit board.

Exemplary Embodiment 5

Lower printed circuit board 2 according to this embodiment is a flexible board. Printed circuit board including flexible boards bonded to rigid boards may generally produce distortion due to shrinkage by heat since there is a large difference in the coefficient of thermal expansion between the rigid boards and the flexible boards. The rigid boards may be separated from the flexible boards due to a significant distortion produced especially when the flexible boards have openings therein. Both of upper printed circuit board 1 and lower printed circuit board 2 are rigid according to Embodiments 1 to 4. According to this embodiment, solid printed circuit board 16 includes lower printed circuit board 2 of a flexible board by the quite same manufacturing method and the structure shown in any of Embodiments 1 to 4.

Solid printed circuit board 16 can be manufactured with the same bonding layer 3 as that of any of Embodiments 1 to 4 by the same processes even when lower printed circuit board 2 is the flexible board. Solid printed circuit board 16 is manufactured by the method using bonding layer 3, and prevents the rigid board from being separated from the flexible board in addition to the various advantages described in Embodiments 1 to 4.

According to this embodiment, recesses 4 is formed in upper printed circuit board 1 made of the rigid board, however, may be formed in lower printed circuit board 2 made of the flexible board, or in both the rigid board and the flexible board. Moreover, recesses 4 may be formed in plural positions.

Exemplary Embodiment 6

Exemplary Embodiment 6 of this invention will be described with reference to accompanying drawings. Components identical to those of Embodiment 1 will be denoted by the same reference numerals, and their description will be omitted. According to Embodiment 6, bonding layer 3 is made of insulating material made of thermoplastic resin, and has via-conductors perforated therein. The via-conductors are filled with conductive paste.

A method of manufacturing the solid printed circuit board according to this embodiment will be described.

Figure 20A:
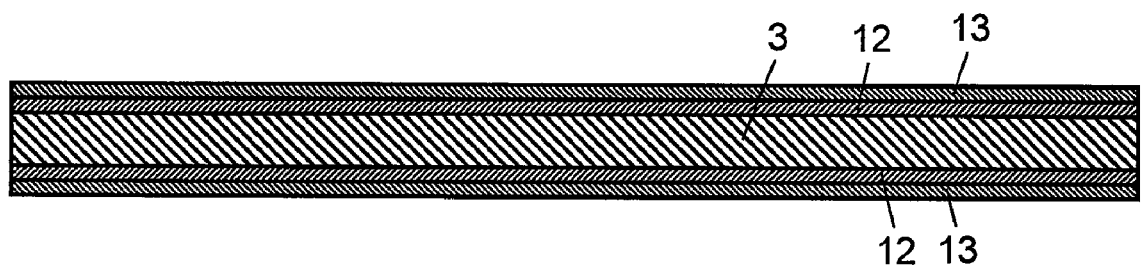
FIG. 20A is a sectional view of a bonding layer of a solid printed circuit board according to Exemplary Embodiment 6 of the invention.

FIGS. 20A, 20B, 20C and 20D are sectional views of bonding layer 3 shown in the order of manufacturing processes. Bonding layer 3 according to Embodiment 3 itself has no adhesiveness at ordinary temperatures, and has adhesive layers 12 formed on surfaces of bonding layer 3 so as to temporarily adhere cover films 13. Adhesive layers are made of thermosetting resin having thicknesses ranging from 1 to 10 μm. Adhesive layer 12 having a thickness less than 1 μm may not adhere uniformly onto the surface of PET film. Adhesive layer 12 having a thickness exceeding 10 μm may cause the conductive paste to flow out in the process of pressing, and may prevent connection with via-conductors. After adhesive layers 12 are formed, cover films 13 are put on both surfaces of bonding layer 3. This configuration is shown in FIG. 20A. Adhesive layers 12 may be put on the bonding layer according to Embodiment 1 which is made of the insulating material containing thermosetting resin and inorganic filler dispersed therein.

Figure 20B:
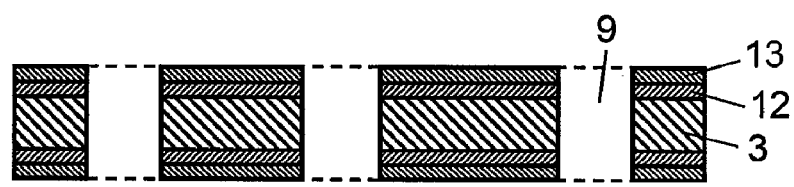
FIG. 20B is a sectional view of the bonding layer of the solid printed circuit board according to Embodiment 6 of the invention.
Figure 20C:
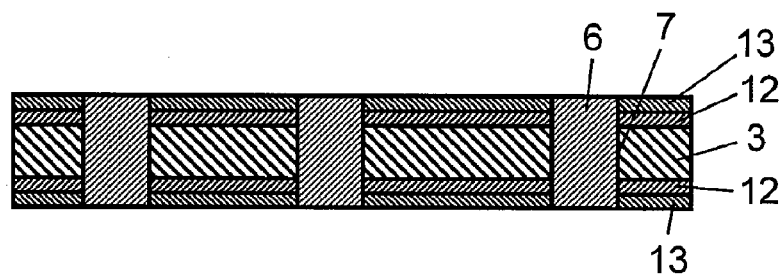
FIG. 20C is a sectional view of the bonding layer of the solid printed circuit board according to Embodiment 6 of the invention.
Figure 20D:
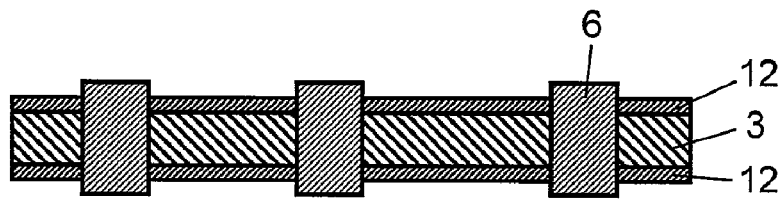
FIG. 20D is a sectional view of the bonding layer of the solid printed circuit board according to Embodiment 6 of the invention.

Adhesive layers 12 may not preferably have a tucking property at ordinary temperatures in order to easy lamination. FIG. 21B is a sectional view of the solid printed circuit board in the next process. As the process of making bonding layer 3, bonding layer 3 is cut to have a shape of upper printed circuit board 1, and through-holes 9 are perforated in the locations for connecting the wirings of upper printed circuit board 1 and lower printed circuit board 2, as shown in FIG. 20B. In the next process, through-holes 9 are filled with conductive paste 6 containing copper or copper alloy to form via-conductors 7, as shown in FIG. 20C. Then, cover films 13 are removed from both surfaces of bonding layer 3, as shown in FIG. 20D, for bonding upper printed circuit board 1 and lower printed circuit board 2 to bonding layer 3.

Figure 21A:
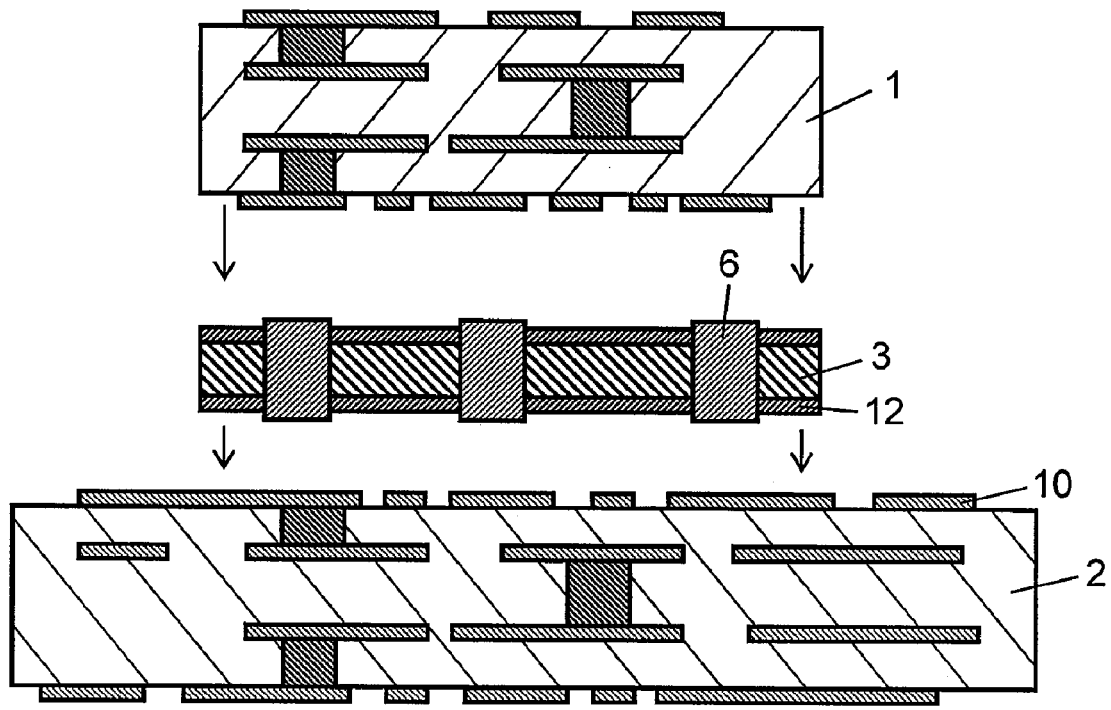
FIG. 21A is a sectional view of an upper printed circuit board, a bonding layer, and a lower printed circuit board of the solid printed circuit board according to Embodiment 6 of the invention.
Figure 21B:
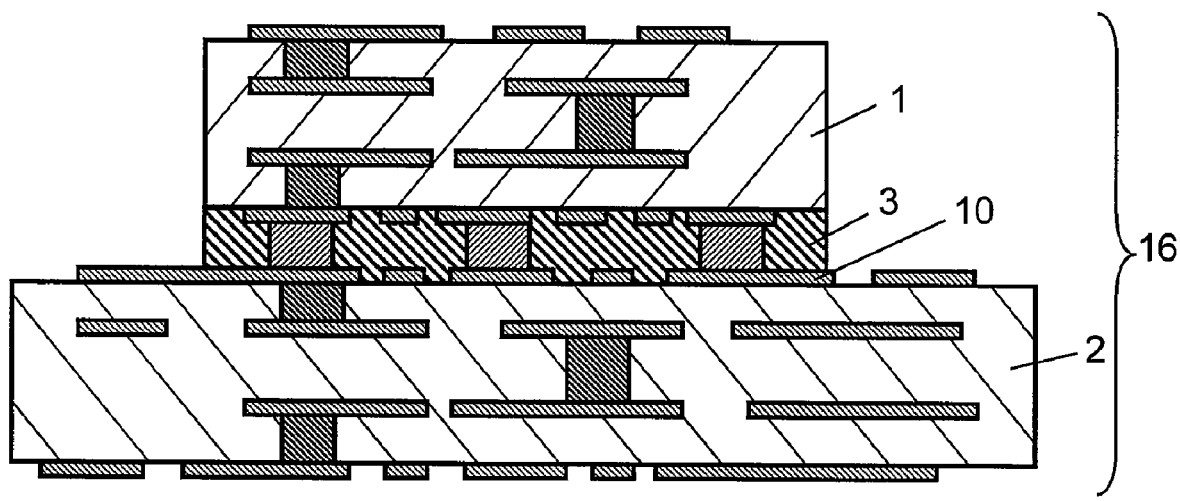
FIG. 21B is a sectional view of the upper printed circuit board, the bonding layer and the lower printed circuit board of the solid printed circuit board according to Embodiment 6 of the invention.

FIG. 21A is a sectional view of upper printed circuit board 1, bonding layer 3, and lower printed circuit board 2 of the solid printed circuit board according to Embodiment 6 of this invention. FIG. 21B is another sectional view of upper printed circuit board 1, bonding layer 3, and lower printed circuit board 2 of solid printed circuit board 16 according to Embodiment 6 of this invention. Bonding layer 3 shown in FIG. 20D is placed on a predetermined position and sandwiched between upper printed circuit board 1 and lower printed circuit board 2, as shown in FIG. 21A. Then, conductive paste 6 is held sandwiched between upper printed circuit board 1 and lower printed circuit board 2 is then laminated by applying heat and pressure to complete solid printed circuit board 16, as shown in FIG. 21B. Wirings 10 are embedded in bonding layer 3 during this lamination process. This process further compresses conductive paste 6 so as to improve connection with wirings 10. According to this embodiment, the bonding processes of bonding layer 3 to lower printed circuit board 2 and to upper printed circuit board 1 may be executed separately as described in Embodiment 1.

Incidentally, adhesive layers 12 may be formed before placing PET films 8 on bonding layer 3 in Embodiment 1. In this case, the material of bonding layer 3 is prevented from damage.

Figure 22:
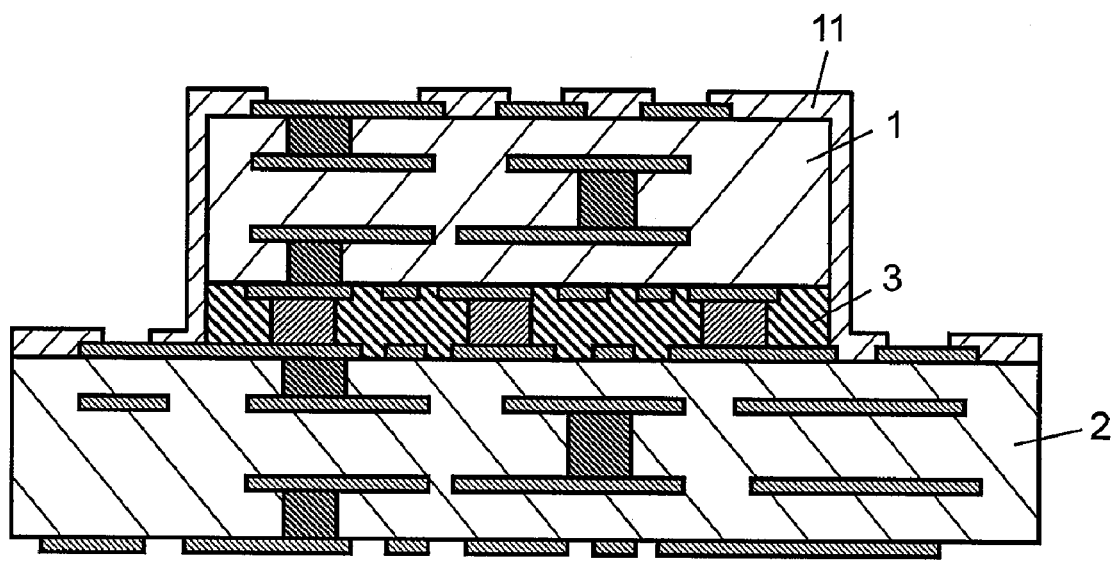
FIG. 22 is a sectional view of the solid printed circuit board according to Embodiment 6 of the invention.
Figure 23:
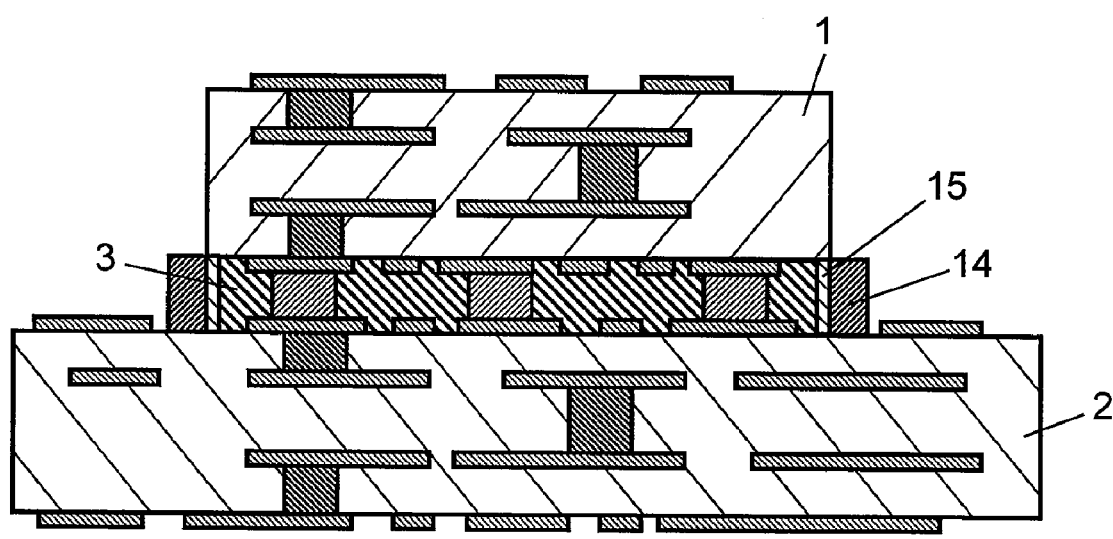
FIG. 23 is a sectional view of the solid printed circuit board according to Embodiment 6 of the invention.
Figure 24:
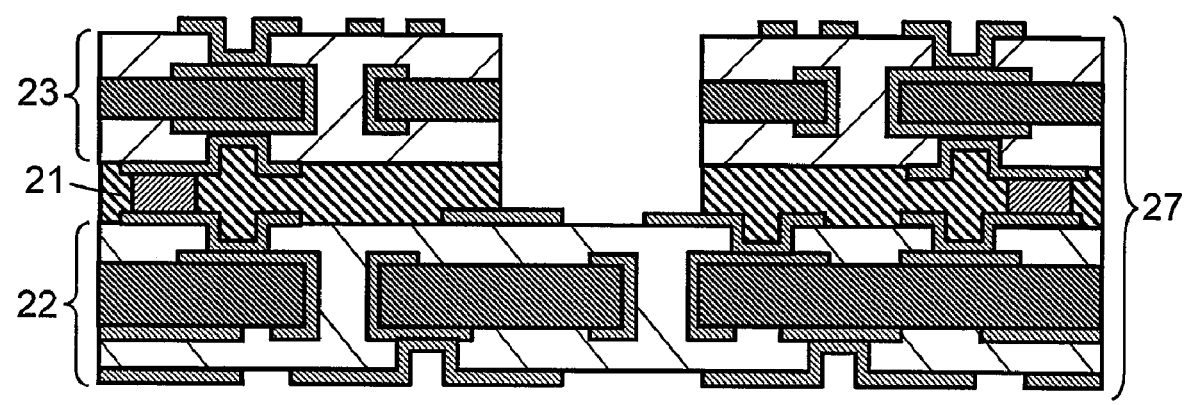
FIG. 24 is a sectional view of a conventional solid printed circuit board.

FIG. 22 is a sectional view of the solid printed circuit board according to Embodiment 6 of this invention. As shown in FIG. 22, permanent resist 11 of dry film having a thickness ranging from 5 to 30 μm may be put similarly to Embodiment 1 in order to prevent dust and powder from collecting on upper printed circuit board 1, lower printed circuit board 2 as well as inside recesses 4, and to avoid troubles in mounting components due to the dust and powder. In the solid printed circuit board according to this invention, the wall surfaces of upper printed circuit board 1, lower printed circuit board 2, and bonding layer 3 may preferably be covered. This structure prevents the dust and powder from collecting especially in corners of recesses 4. Permanent resist 11 having a thickness thereof less than 5 μm may have pinholes therein, thus being not effective. Permanent resist 11 having a thickness exceeding 30 μm may not adhere closely to protrusions and recesses on the surface of the circuit board.

Bonding layer 3 according to this embodiment is made of thermoplastic resin, such as PPS (polyphenylene sulfide), PEEK (polyether ether ketone), PES (polyether sulfone), or thermoplastic polyimide.

Bonding layer 3 according to Embodiment 6 has been described as the structure based on that of Embodiment 1, and may be based on the structure according to Embodiments 2 to 5, providing the same effects.

According to the above embodiments, the insulating material of upper printed circuit board 1 and lower printed circuit board 2 are composite material including glass woven fabric and epoxy resin. However, the insulating material may be another composite material including woven fabric of either organic fiber selected from a group consisting of aramid and fully aromatic polyester or inorganic fiber selected from a group consisting of glass fiber and alumina fiber, and thermosetting resin. Or, the insulating material may be made of still another composite material including unwoven fabric of either organic fiber selected from a group consisting of p-aramid, polyimide, poly-p-phenylene benzobisoxazole, fully aromatic polyester, PTFE, polyether sulfone and polyether imide or inorganic fiber selected from a group consisting of glass fiber and alumina fiber, and thermosetting resin. The insulating material may be made of another composite material including layers of a thermosetting resin formed on both surfaces of a film comprised of at least one of synthetic resins among p-aramid, poly-p-phenylene benzobisoxazole, fully aromatic polyester, polyether imide, polyether ketone, polyether ether ketone, polyethylene terephthalate, polytetrafluoroethylene, polyether sulfone, polyester terephthalate, polyimide and polyphenylene sulfide.

The thermosetting resin may be preferably at least one of materials selected from a group consisting of epoxy resin, polybutadiene resin, phenol resin, polyimide resin, polyamide resin and cyanate resin.

INDUSTRIAL APPLICABILITY

A solid printed circuit board according to the present invention can have a small overall thickness after a component is mounted as a package unit. The solid printed circuit board is therefore useful as a package board and a module board to satisfy the need of reducing size, thickness and weight as well as increasing density and versatility for such applications as personal computers, digital cameras and mobile phones. This circuit board is applicable to a package board achieving low-profiling and three-dimensional mounting of semiconductor packages. performance and multiple-pin structure.

The invention claimed is:

1. A solid printed circuit board comprising:
an upper printed circuit board having a wiring on a surface thereof;

a lower printed circuit board having a wiring on a surface thereon, the lower printed circuit board and the upper printed circuit board having shapes different from each other;

a bonding layer connecting between the upper printed circuit board and the lower printed circuit board; and a solder resist provided around a peripheral edge of the bonding layer, wherein the bonding layer is made of insulating material containing resin, and has a via-conductor made of a conductive paste filling a through-hole perforated in the bonding layer, wherein the bonding layer has an area smaller than an area of the upper printed circuit board, and wherein the solder resist around the peripheral edge of the bonding layer protrudes from the lower printed circuit board.

2. The solid printed circuit board according to claim 1, wherein the bonding layer comprises thermosetting resin and inorganic filler dispersed in the thermosetting resin.

3. The solid printed circuit board according to claim 1, wherein the bonding layer comprises thermoplastic resin.

4. The solid printed circuit board according to claim 1, wherein the bonding layer does not contain a core material.

5. The solid printed circuit board according to claim 1, further comprising an insulating film covering a portion of the bonding layer and a portion of the lower printed circuit board.

6. The solid printed circuit board according to claim 5, wherein the insulating film contains antistatic agent.

7. The solid printed circuit board according to claim 5, wherein the bonding layer contains coloring agent.

8. The solid printed circuit board according to claim 5, further comprising a metal film covering an opening provided in the upper printed circuit board.

9. The solid printed circuit board according to claim 1, wherein
the upper printed circuit board has frame shape, and
the solid printed circuit board has an overall thickness not larger than 400 µm.

10. The solid printed circuit board according to claim 1, wherein a solder resist is formed on an area of the lower circuit board exposed after the upper printed circuit board and the lower printed circuit board are laminated.

11. The solid printed circuit board according to claim 1, wherein the lower printed circuit board is made of a flexible board.

12. A method of manufacturing a solid printed circuit board, comprising:
providing an upper printed circuit board, a lower printed circuit board, a bonding layer, and a solder resist, the upper printed circuit board having a wiring formed on a surface thereof, the lower printed circuit board having a wiring formed on a surface thereof, the bonding layer being made of insulating material containing resin for bonding the upper printed circuit board to the lower printed circuit board the solder resist being provided around a peripheral edge of the bonding layer;
cutting the upper printed circuit board and the bonding layer into predetermined shapes to form a solid structure;
perforating a through-hole in the bonding layer;
filling the through-hole with conductive paste;
placing the bonding layer on one of the lower printed circuit board and the upper printed circuit board; and
laminating the lower printed circuit board, the bonding layer, and the upper printed circuit board by applying heat and pressure,
wherein the bonding layer has an area smaller than an area of the upper printed circuit board, and
wherein the solder resist around the peripheral edge of the bonding layer protrudes from the lower printed circuit board.

13. A solid printed circuit board comprising:
an upper printed circuit board having a wiring on a surface thereof;
a lower printed circuit board having a wiring on a surface thereon, the lower printed circuit board and the upper printed circuit board having shapes different from each other;
a bonding layer connecting between the upper printed circuit board and the lower printed circuit board; and
an insulating film covering a portion of the bonding layer and a portion of the lower printed circuit board,
wherein the bonding layer is made of insulating material containing resin, and has a via-conductor made of a conductive paste filling a through-hole perforated in the bonding layer.

14. The solid printed circuit board according to claim 13, wherein the insulating film contains antistatic agent.

15. A solid printed circuit board comprising:
an upper printed circuit board having a wiring on a surface thereof;
a lower printed circuit board having a wiring on a surface thereon, the lower printed circuit board and the upper printed circuit board having shapes different from each other; and
a bonding layer connecting between the upper printed circuit board and the lower printed circuit board,
wherein the bonding layer is made of insulating material containing resin, and has a via-conductor made of a conductive paste filling a through-hole perforated in the bonding layer, and
wherein the bonding layer contains coloring agent.

16. A solid printed circuit board comprising:
an upper printed circuit board having a wiring on a surface thereof;
a lower printed circuit board having a wiring on a surface thereon, the lower printed circuit board and the upper printed circuit board having shapes different from each other; and
a bonding layer connecting between the upper printed circuit board and the lower printed circuit board,
wherein the bonding layer is made of insulating material containing resin, and has a via-conductor made of a conductive paste filling a through-hole perforated in the bonding layer,
wherein the upper printed circuit board has frame shape, and
wherein the solid printed circuit board has an overall thickness not larger than 400 µm.

* * * * *